(12) United States Patent
Xie et al.

(10) Patent No.: US 9,773,867 B2
(45) Date of Patent: Sep. 26, 2017

(54) FINFET SEMICONDUCTOR DEVICES WITH REPLACEMENT GATE STRUCTURES

(71) Applicants: GLOBALFOUNDRIES Inc., Grand Cayman (KY); International Business Machines Corporation, Armonk, NY (US)

(72) Inventors: Ruilong Xie, Niskayuna, NY (US); Xiuyu Cai, Niskayuna, NY (US); Kangguo Cheng, Schenectady, NY (US); Ali Khakifirooz, Mountain View, CA (US)

(73) Assignees: GLOBALFOUNDRIES Inc., Grand Cayman (KY); International Business Machines Corporation, Armonk, NY (US)

(*) Notice: Subject to any disclaimer, the term of this patent is extended or adjusted under 35 U.S.C. 154(b) by 0 days.

(21) Appl. No.: 14/962,015

(22) Filed: Dec. 8, 2015

(65) Prior Publication Data

US 2016/0093692 A1 Mar. 31, 2016

Related U.S. Application Data

(62) Division of application No. 14/044,120, filed on Oct. 2, 2013, now Pat. No. 9,236,480.

(51) Int. Cl.
*H01L 29/06* (2006.01)
*H01L 21/762* (2006.01)
(Continued)

(52) U.S. Cl.
CPC .... *H01L 29/0649* (2013.01); *H01L 21/76224* (2013.01); *H01L 21/823431* (2013.01);
(Continued)

(58) Field of Classification Search
CPC .......... H01L 29/0649; H01L 29/66545; H01L 29/41791; H01L 29/42376; H01L 29/785;
(Continued)

(56) References Cited

U.S. PATENT DOCUMENTS 6,509,611 B1   1/2003 Park et al.
8,722,498 B2   5/2014 Scheiper et al.
(Continued)

FOREIGN PATENT DOCUMENTS

DE   102010064283 A1   6/2012

OTHER PUBLICATIONS

Taiwan Office Action dated Apr. 28, 2016, for Taiwan Patent Application No. 103134170, filed on Oct. 1, 2014.
Translation of Official Communication from Chinese Patent Application No. 201410524980.5 dated Dec. 15, 2016.
Translation of Official Communication from German Patent Application No. 11 2014 219 912.3 dated Nov. 18, 2016.

*Primary Examiner* — Marc Armand
*Assistant Examiner* — Sue Tang
(74) *Attorney, Agent, or Firm* — Amerson Law Firm, PLLC

(57) ABSTRACT

A device includes first and second fins defined in a semiconductor substrate and a raised isolation post structure positioned between the first and second fins, wherein an upper surface of the raised isolation post structure is at a level that is approximately equal to or greater than a level corresponding to an upper surface of each of the first and second fins. A first space is defined by a sidewall of the first fin and a first sidewall of the raised isolation post structure, a second space is defined by a sidewall of the second fin and a second sidewall of the raised isolation post structure, and a gate structure is positioned around a portion of each of the first and second fins and around a portion of the raised isolation post structure, wherein at least portions of the gate structure are positioned in the first and second spaces.

20 Claims, 27 Drawing Sheets

(51) Int. Cl.
*H01L 27/088* (2006.01)
*H01L 29/66* (2006.01)
*H01L 29/78* (2006.01)
*H01L 21/8234* (2006.01)
*H01L 29/423* (2006.01)
*H01L 29/417* (2006.01)

(52) U.S. Cl.
CPC .... *H01L 27/0886* (2013.01); *H01L 29/41791* (2013.01); *H01L 29/42376* (2013.01); *H01L 29/66545* (2013.01); *H01L 29/66795* (2013.01); *H01L 29/785* (2013.01); *H01L 29/7851* (2013.01)

(58) Field of Classification Search
CPC ......... H01L 21/823431; H01L 27/0886; H01L 29/7851; H01L 29/66795; H01L 21/76224
See application file for complete search history.

(56) References Cited

U.S. PATENT DOCUMENTS

| | | |
|---|---|---|
| 2005/0239252 A1 | 10/2005 | Ahn et al. |
| 2005/0250285 A1 | 11/2005 | Yoon et al. |
| 2005/0272190 A1* | 12/2005 | Lee ................... H01L 21/28052 438/176 |
| 2006/0043616 A1 | 3/2006 | Anderson et al. |
| 2009/0001471 A1 | 1/2009 | Ohmi et al. |
| 2010/0327360 A1* | 12/2010 | Anderson ......... H01L 21/28123 257/365 |
| 2011/0115023 A1 | 5/2011 | Cheng et al. |
| 2012/0161238 A1 | 6/2012 | Scheiper et al. |
| 2014/0264597 A1* | 9/2014 | Kim ....................... H01L 21/76 257/347 |

\* cited by examiner

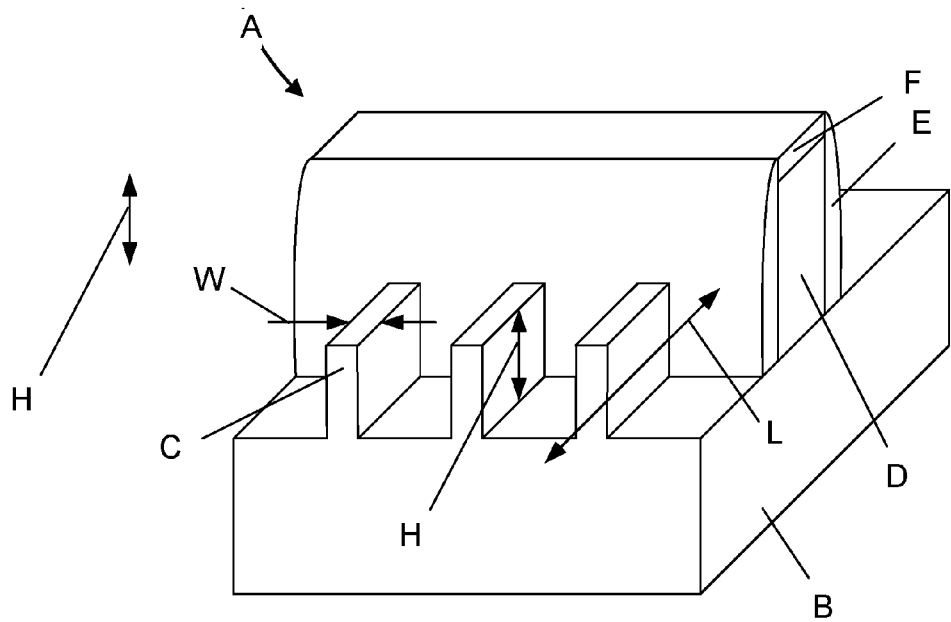
Figure 1A (Prior Art)
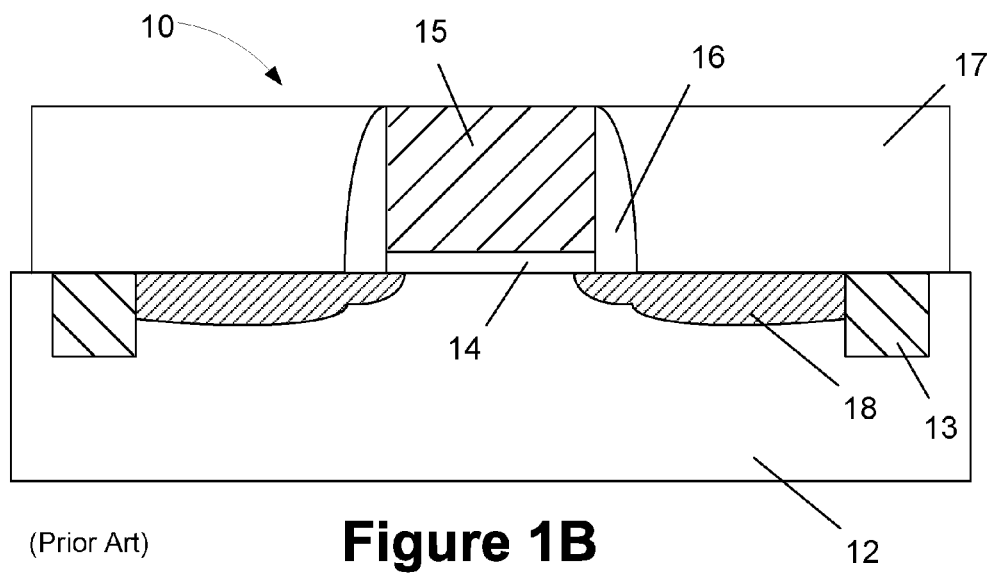
(Prior Art) Figure 1B

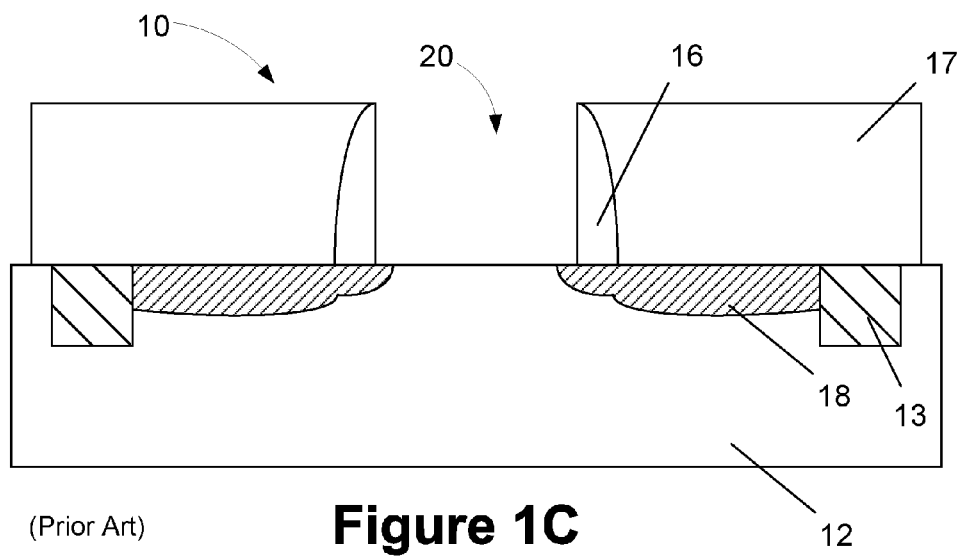
(Prior Art) Figure 1C
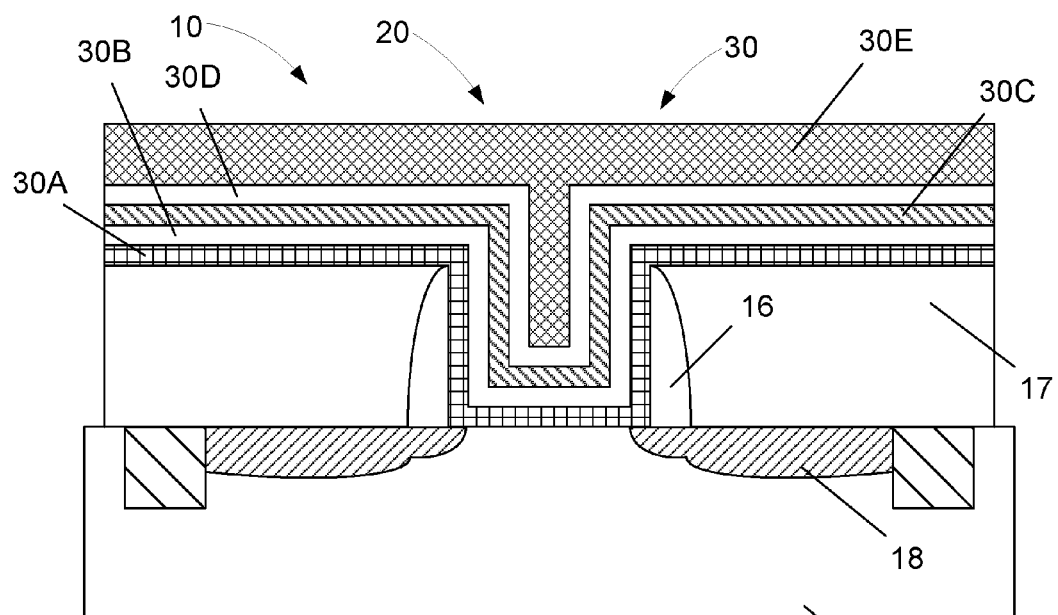
(Prior Art) Figure 1D

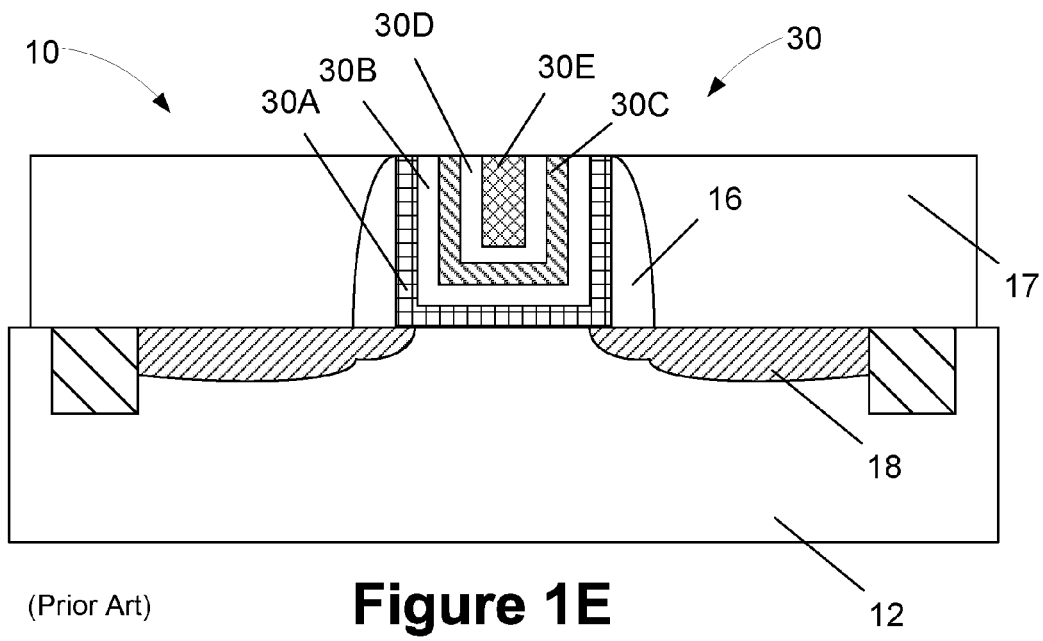
(Prior Art) Figure 1E
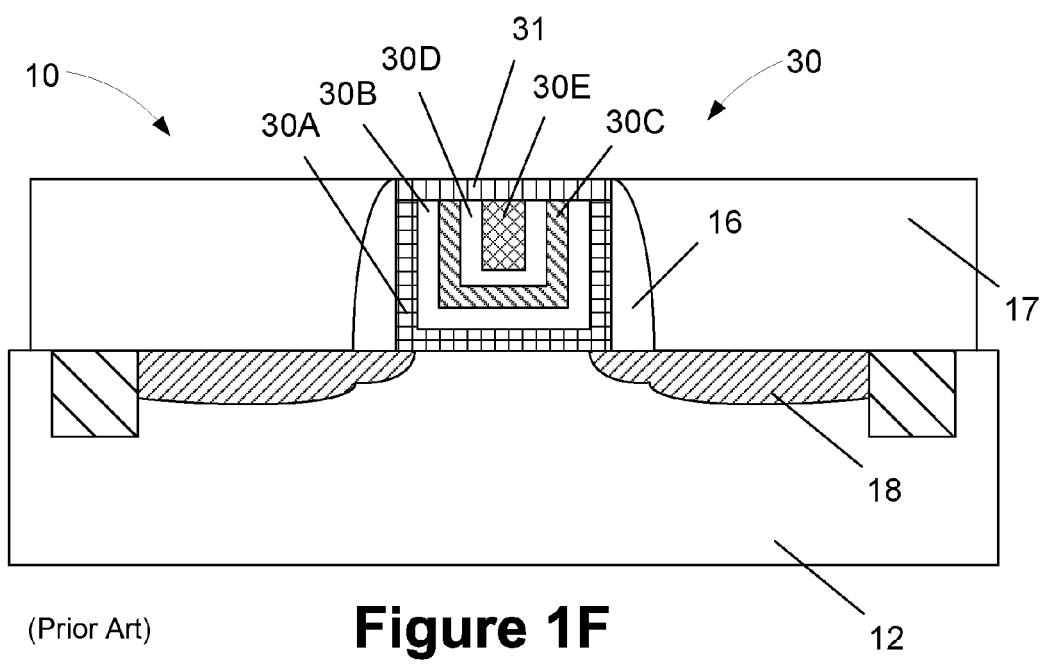
(Prior Art) Figure 1F

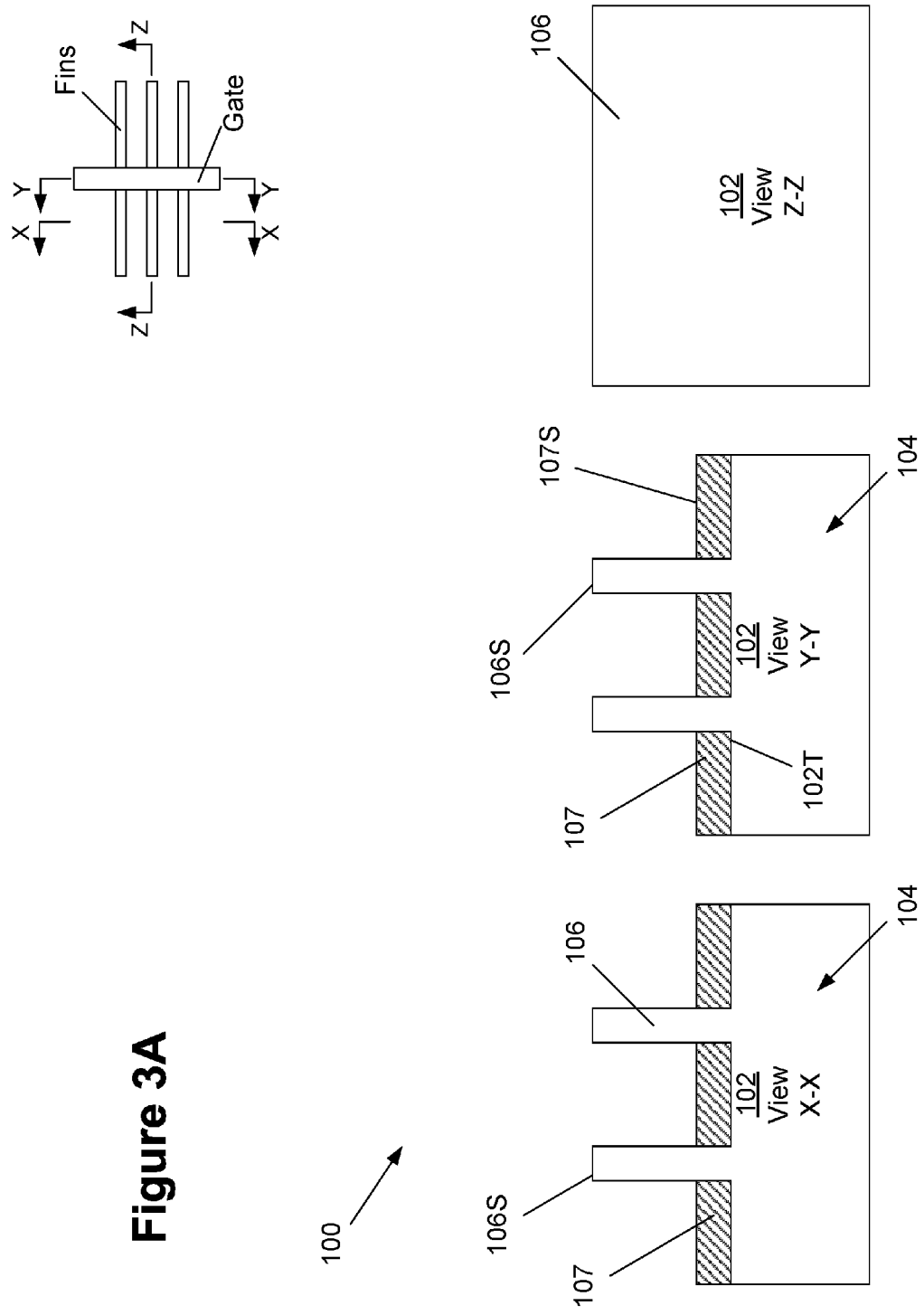

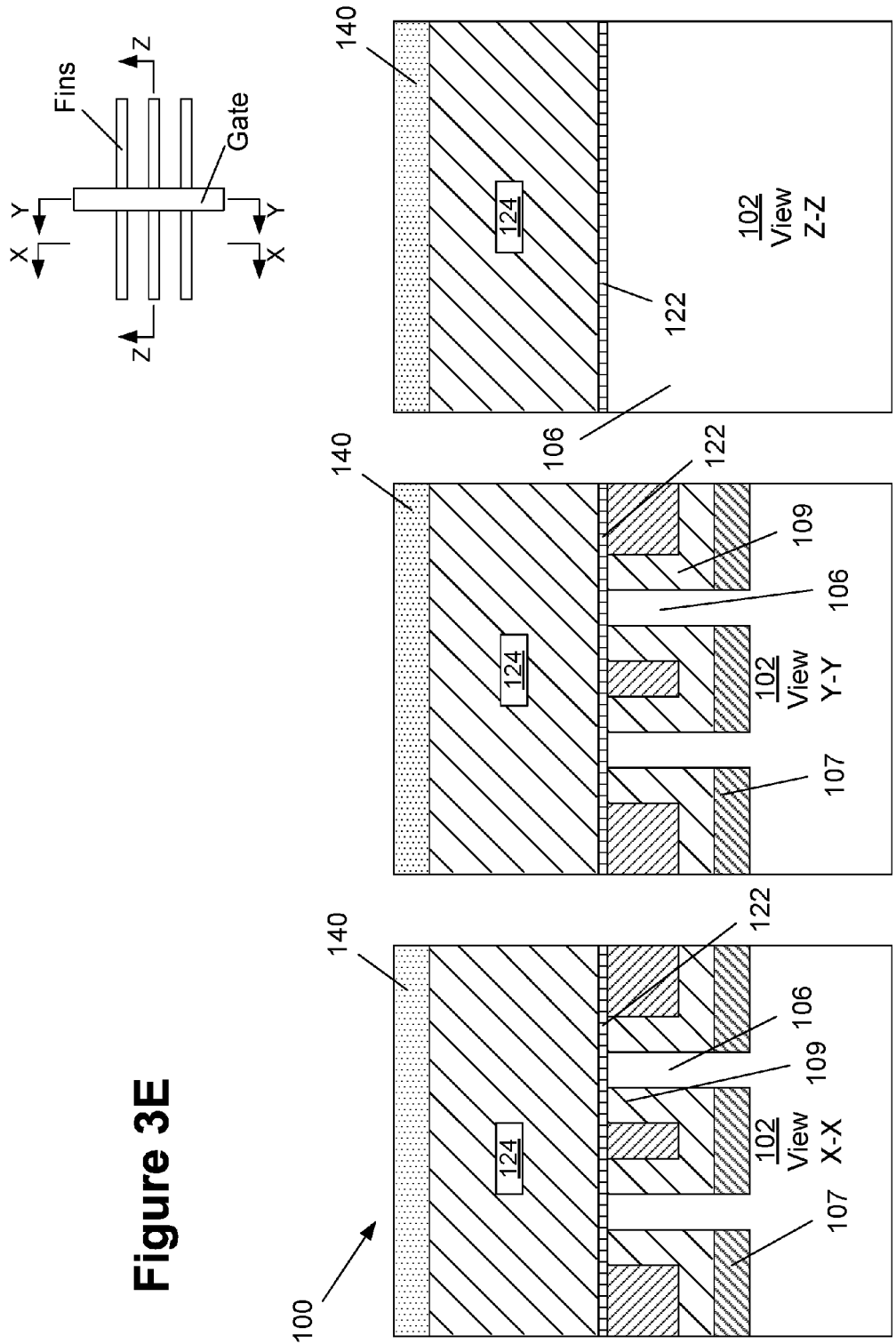

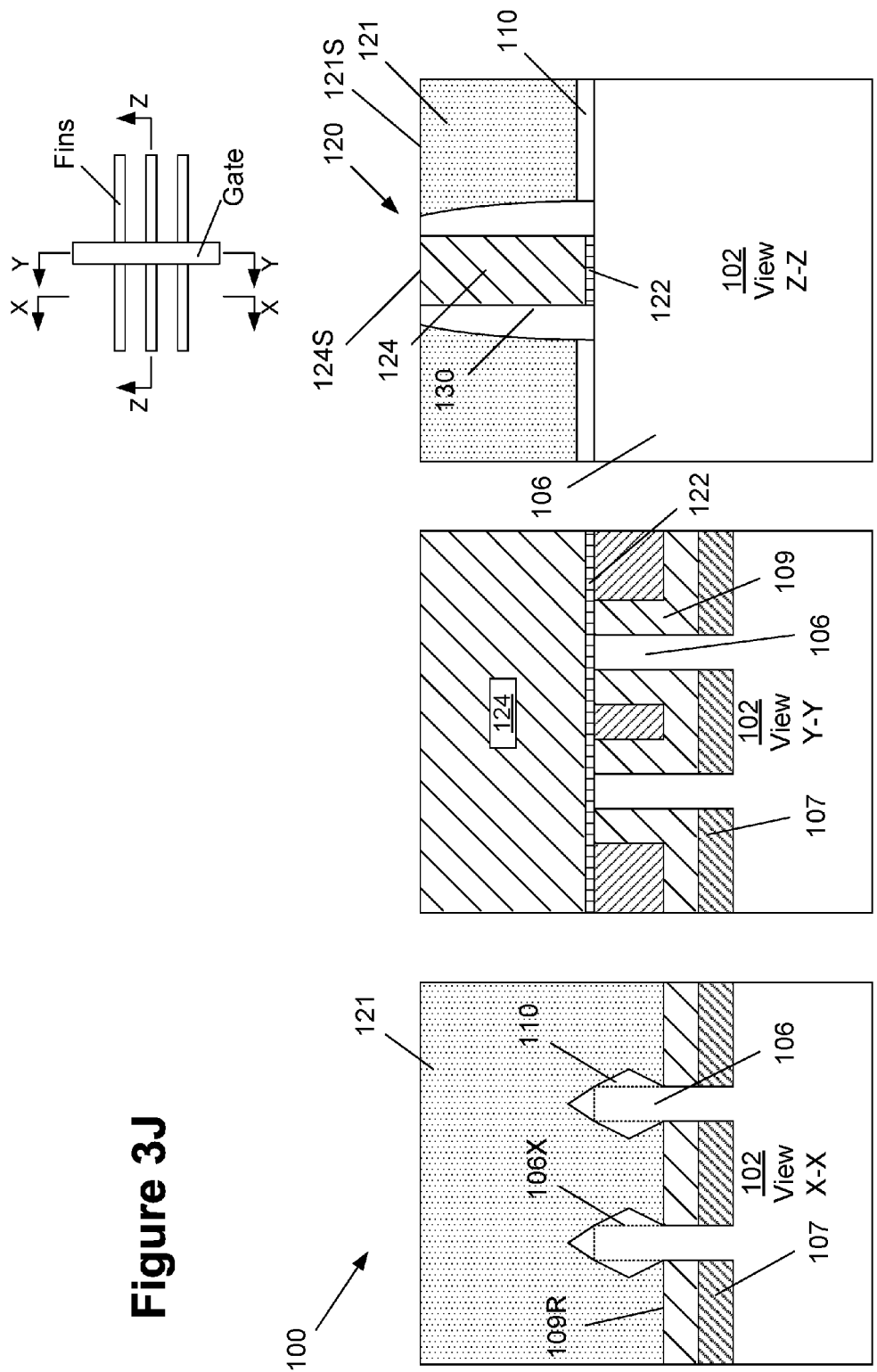

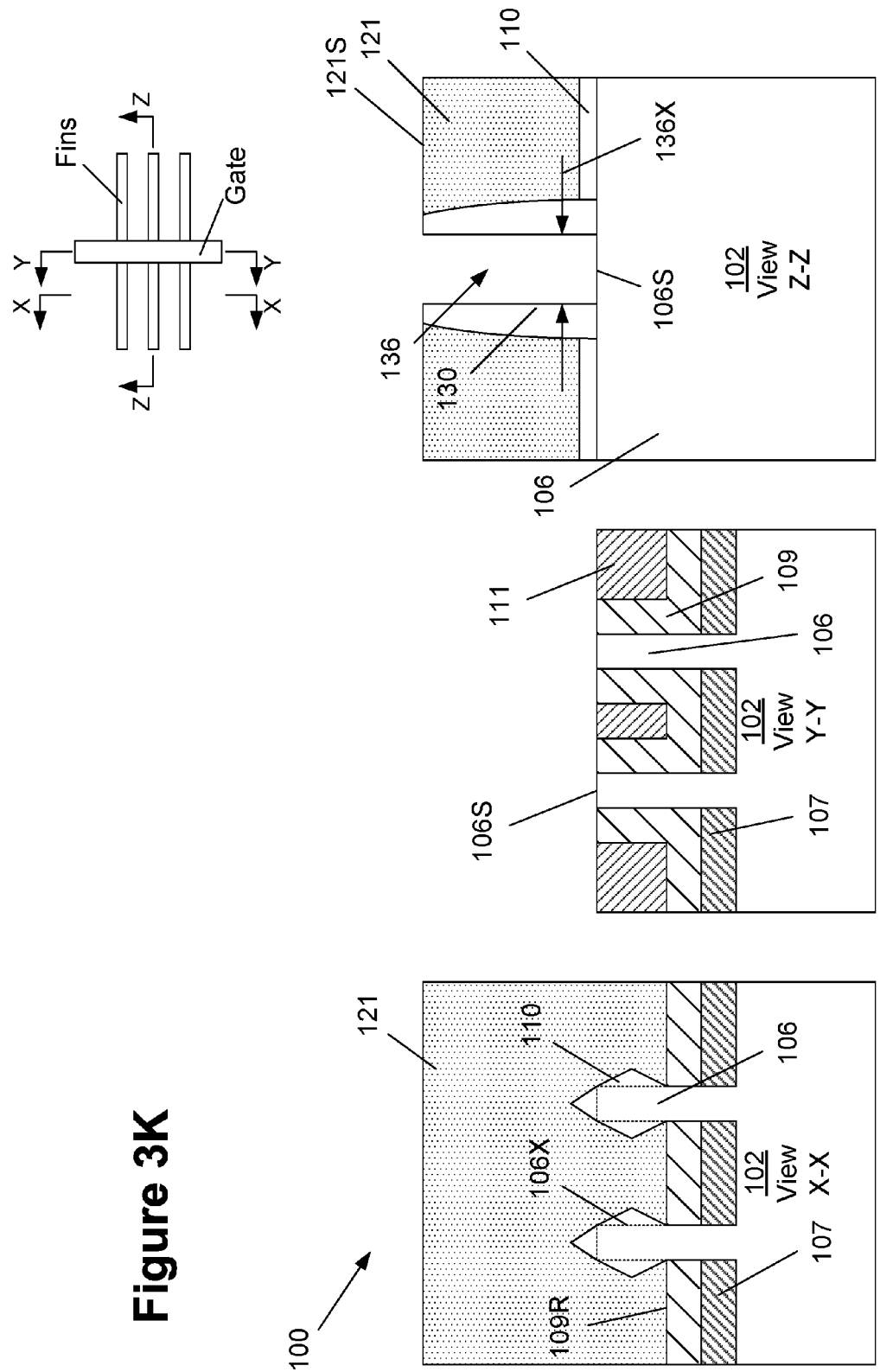

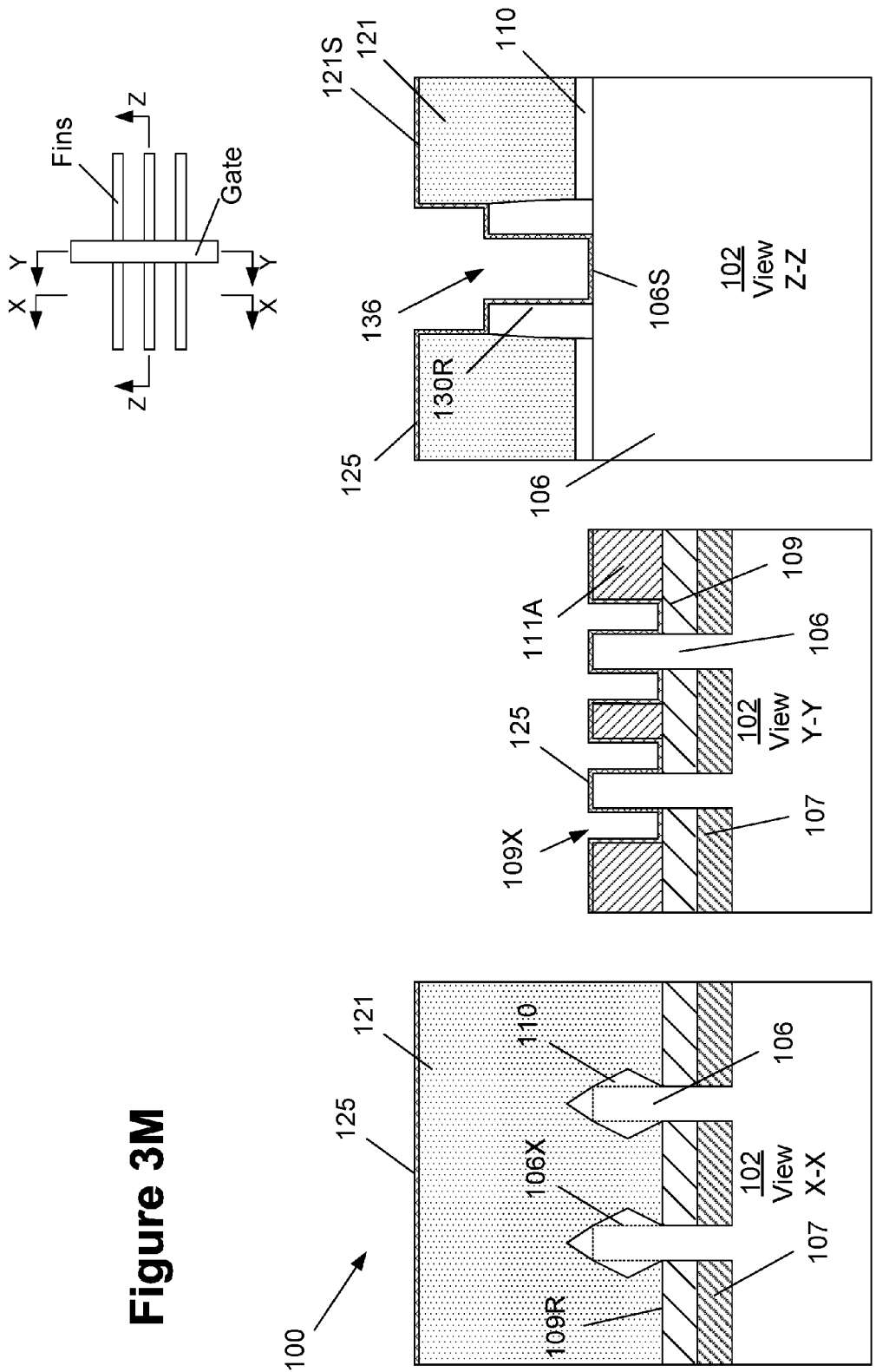

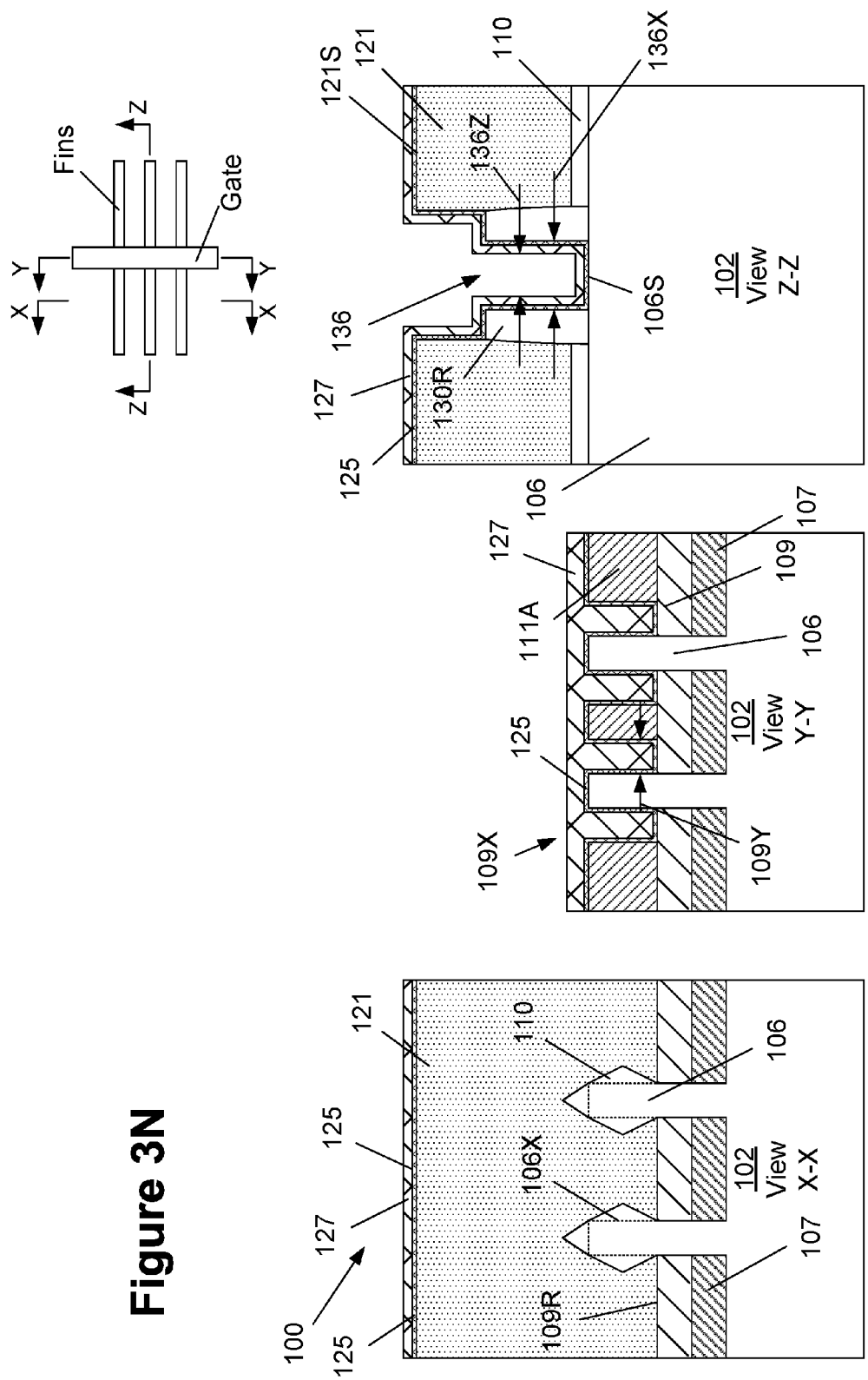

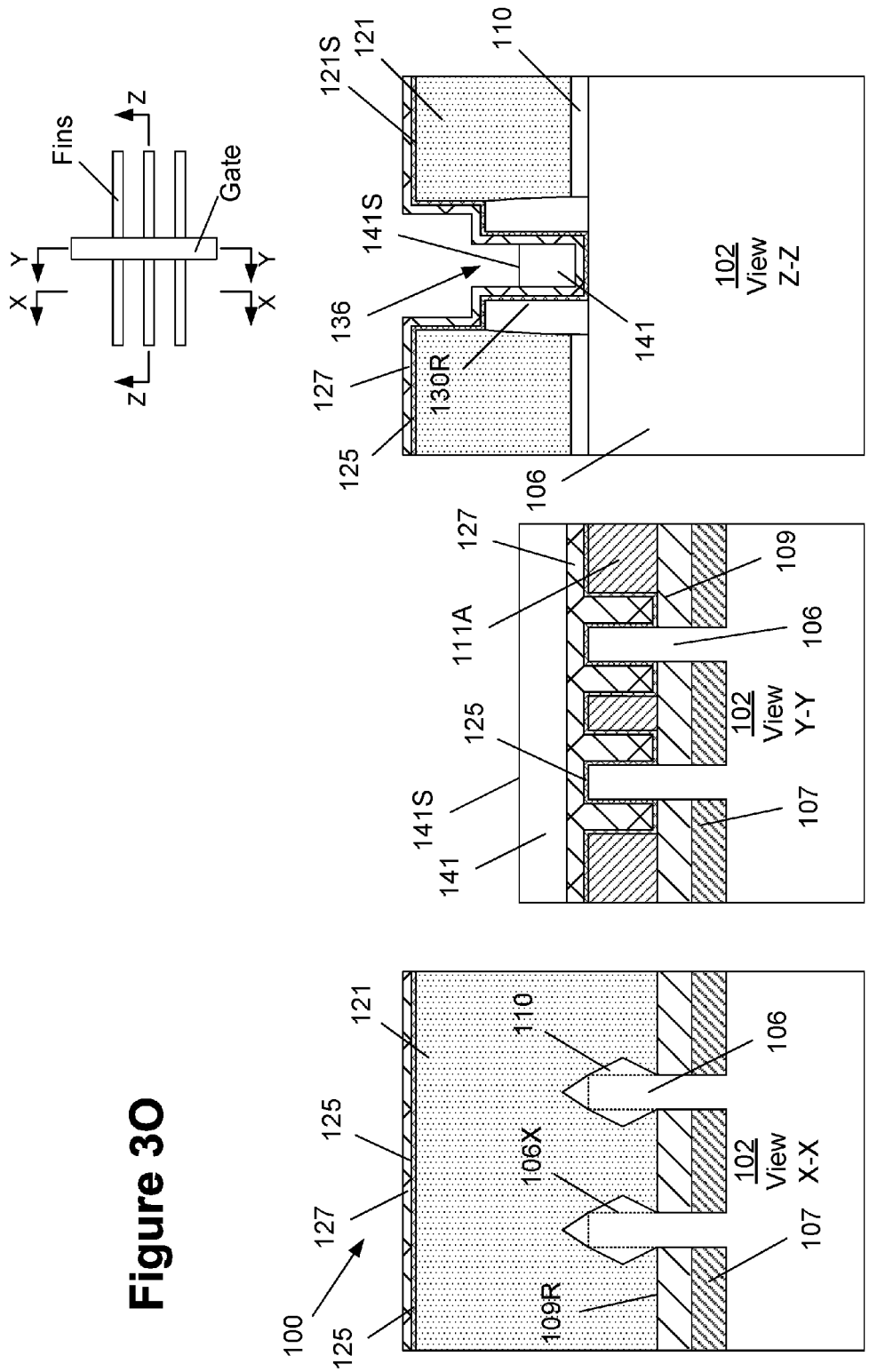

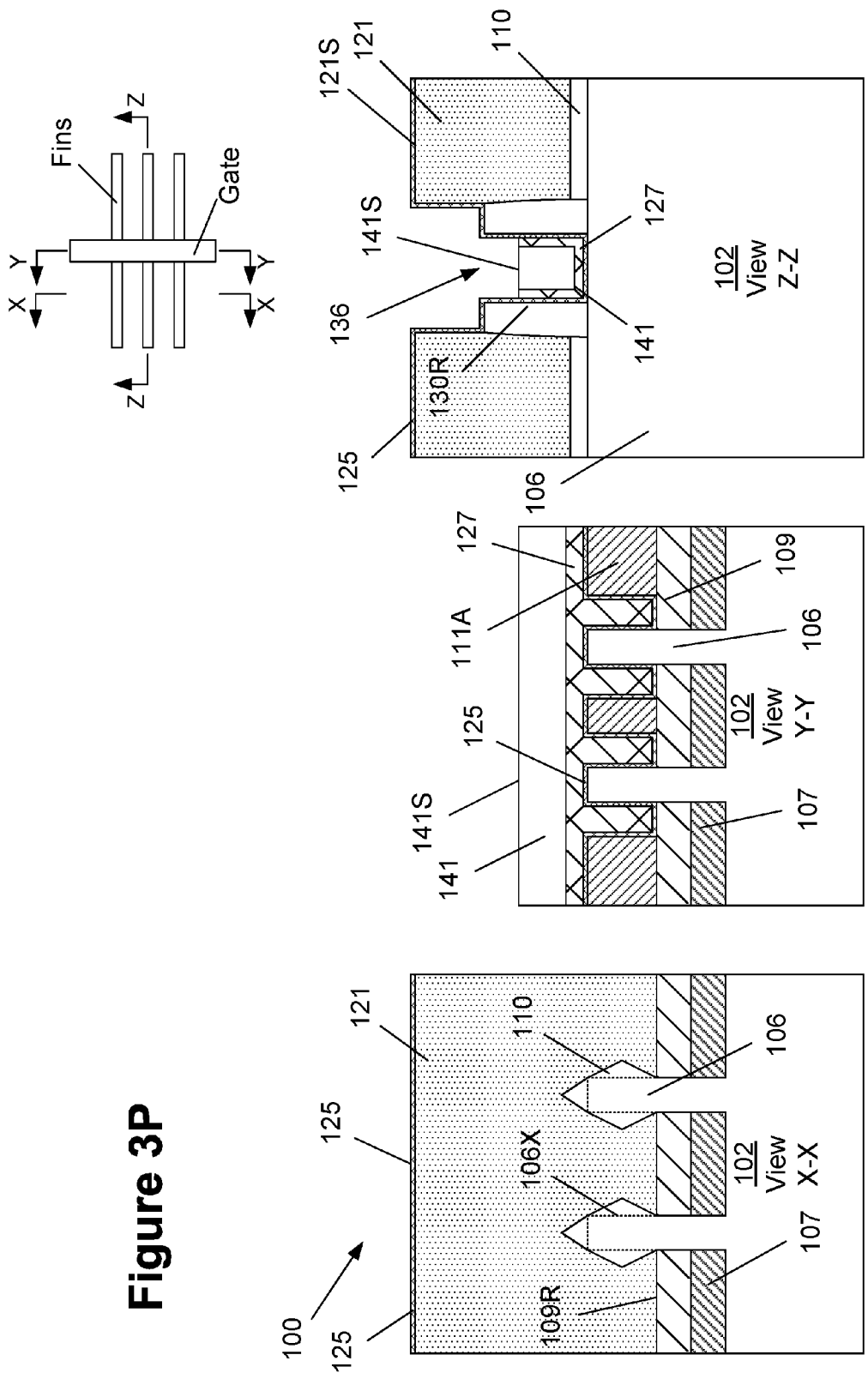

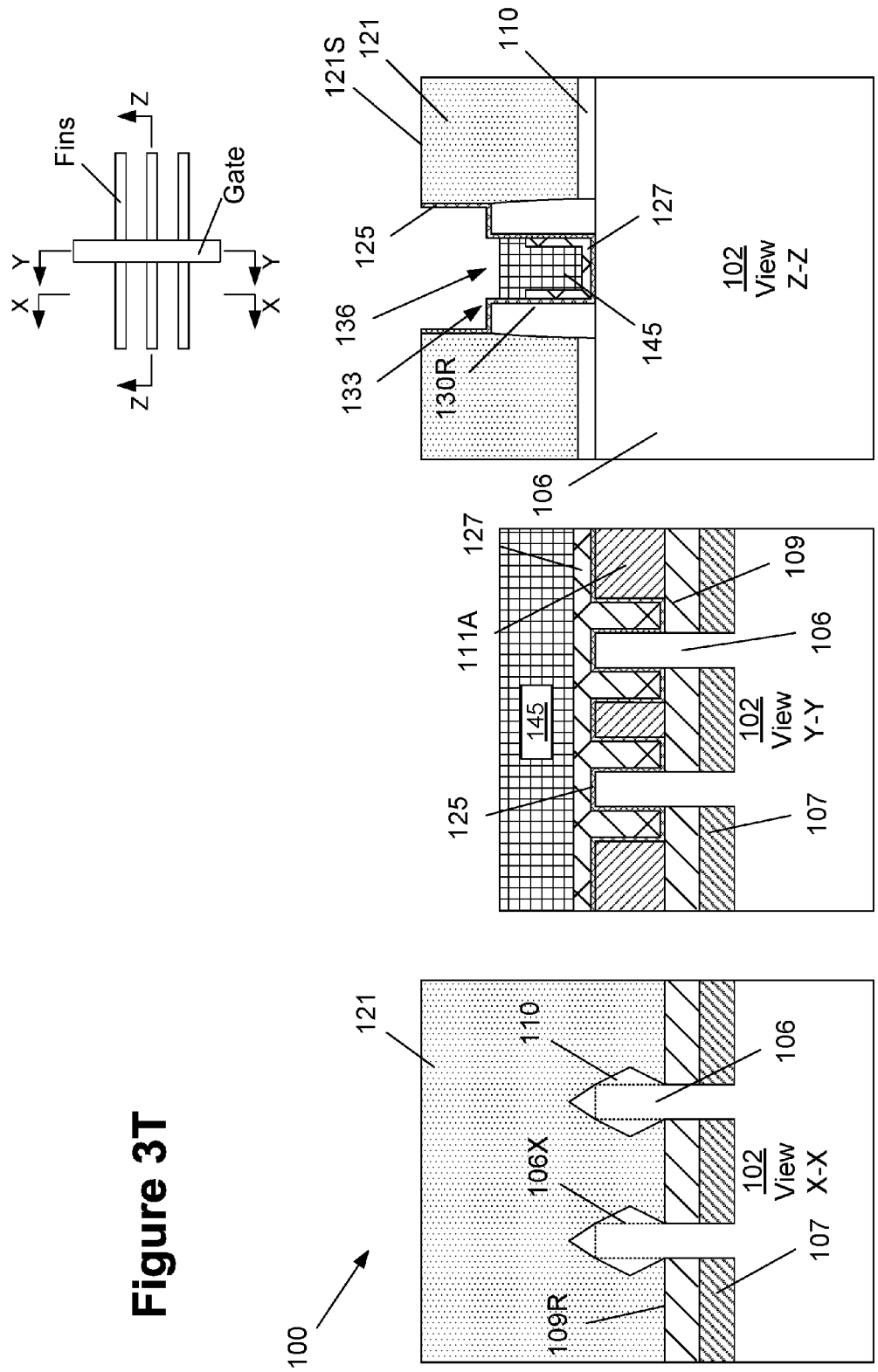

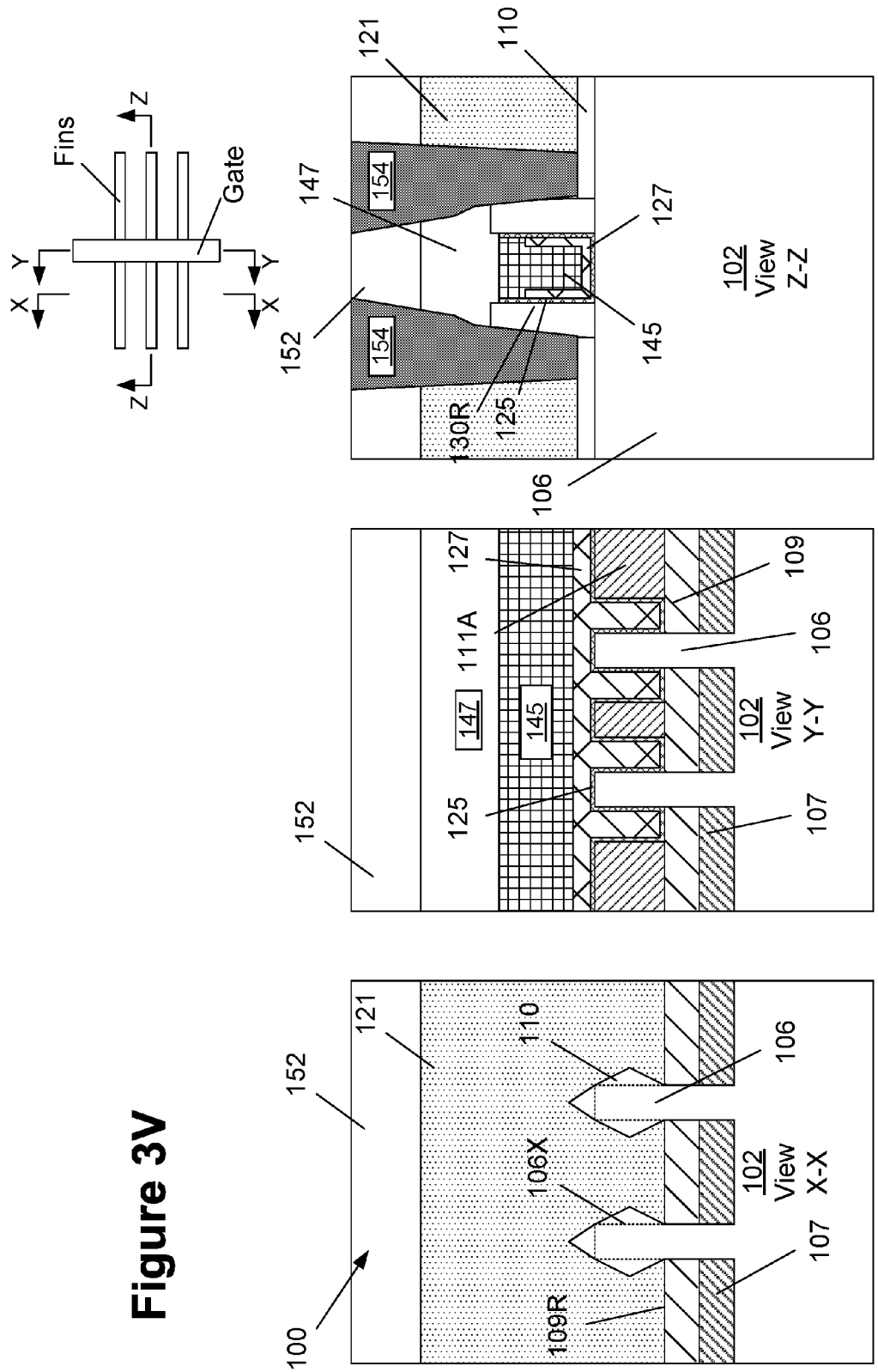

FINFET SEMICONDUCTOR DEVICES WITH REPLACEMENT GATE STRUCTURES

BACKGROUND

1. Field of the Disclosure

The present disclosure generally relates to the fabrication of integrated circuits, and, more particularly, to various methods of forming FinFET semiconductor devices using a replacement gate technique and the resulting semiconductor devices.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. The gate structure D is typically comprised of a layer of gate insulating material (not separately shown), e.g., a layer of high-k insulating material or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source drain regions. Even if an epi "merger" process is not performed, an epi growth process will typically be performed on the fins C to increase their physical size.

In the FinFET device A, the gate structure D may enclose both sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a single fin FinFET device, the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond. The gate structures D for such FinFET devices may be manufactured using so-called "gate-first" or "replacement gate" (gate-last) manufacturing techniques.

For many early device technology generations, the gate structures of most transistor elements (planar or FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3D devices. FIGS. 1B-1E simplistically depict one illustrative prior art method for forming an HK/MG replacement gate structure using a replacement gate technique on a planar transistor device. As shown in FIG. 1B, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1B, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1C, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications.

Next, as shown in FIG. 1D, various layers of material that will constitute a replacement gate structure 30 are formed in the gate cavity 20. Even in cases where the sacrificial gate insulation layer 14 is intentionally removed, there will typically be a very thin native oxide layer (not shown) that forms on the substrate 12 within the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

Ultimately, as shown in FIG. 1E, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1F depicts the device 10 after several process operations were performed. First, one or more etching processes were performed to remove upper portions of the various materials within the cavity 20 so as to form a recess within the gate cavity 20. Then, a gate cap layer 31 was formed in the recess above the recessed gate materials. The gate cap layer 31 is typically comprised of silicon nitride and it may be formed by depositing a layer of gate cap material so as to over-fill the recess formed in the gate cavity and, thereafter, performing a CMP process to remove excess portions of the gate cap material layer positioned above the surface of the layer of insulating material 17. The gate cap layer 31 is formed so as to protect the underlying gate materials during subsequent processing operations.

As the gate length of transistor devices has decreased, the physical size of the gate cavity 20 has also decreased. Thus, it is becoming physically difficult to fit all of the layers of material needed for the replacement gate structure 30, particularly for NMOS devices, due to the greater number of layers of material that are typically used to form the gate structures for the NMOS devices, within the reduced-size gate cavity. For example, as gate lengths continue to decrease, voids or seams may be formed as the various layers of material are deposited into the gate cavity 20. FIG. 1G is a somewhat enlarged view of an illustrative NMOS device that is provided in an attempt to provide the reader with some idea of just how limited the lateral space 20S is within the gate cavity 20 of an NMOS device as the various metal layers 30A-30D are formed in the gate cavity 20. In FIG. 1G, the internal sidewall surfaces of the spacers 16 define a gate cavity 20 having a substantially uniform width 20S throughout the height or depth of the gate cavity 20. As the layers of material in the gate stack for the device are formed in the cavity 20, the remaining space 39 within the gate cavity 20 becomes very small. As the latter metal layers are formed, the lateral space 39 may be about 1-2 nm in width or even smaller. In some cases, the space 39 may be essentially non-existent. This may lead to so-called "pinch-off" of metal layers such that voids or seams may be formed in the overall gate stack, which may result in devices that perform at levels less than anticipated or, in some cases, the formation of devices that are simply not acceptable and have to be discarded. Additionally, an etch-back process is traditionally performed on the layers 30A-D to make room within the upper portion of the gate cavity 20 for a bulk conductor material, such as tungsten and aluminum, and a gate cap layer. During this recess etching process, some form of a protective material must be formed in the gate cavity 20 above the metal layer 30D to protect desired portions of the underlying metal layers during the recess etching process. If the lateral space 39 (to the extent it exists) cannot be reliably filled with such a protective material, such as a flowable oxide material, then the recessing etching process cannot be performed for fear of removing undesired portions of the metal layers during the course of performing the recess etching process.

Over recent years, due to the reduced dimensions of the transistor devices, the operating speed of the circuit components has been increased with every new device generation, and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level that includes the actual semiconductor-based circuit elements. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer by a conductive via. As device dimensions have decreased, the conductive contact elements in the contact level have to be provided with critical dimensions in the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. For this reason, contact technologies have been developed in which contact openings are formed in a self-aligned manner by removing dielectric material, such as silicon dioxide, selectively from the spaces between closely spaced gate electrode structures. That is, after completing the transistor structure, the gate electrode structures are used as etch masks for selectively removing the silicon dioxide material in order to expose the source/drain regions of the transistors, thereby providing self-aligned trenches which are substantially laterally delineated by the spacer structures of the gate electrode structures.

However, the aforementioned process of forming self-aligned contacts results in an undesirable loss of the materials that protect the conductive gate electrode, i.e., the gate cap layer and the sidewall spacers, as will be explained with reference to FIGS. 2A-2B. FIG. 2A schematically illustrates a cross-sectional view of an integrated circuit product 40 at an advanced manufacturing stage. As illustrated, the product 40 comprises a plurality of illustrative gate structures 41 that are formed above a substrate 42, such as a silicon substrate. The gate structures 41 are comprised of an illustrative gate insulation layer 43 and an illustrative gate electrode 44 that are formed in a gate cavity 20 using a gate-last processing technique. An illustrative gate cap layer 46 and sidewall spacers 48 encapsulate and protect the gate structures 41. The gate cap layer 46 and sidewall spacers 48 are typically made of silicon nitride. Also depicted in FIG. 2A are a plurality of raised source/drain regions 50 and a layer of insulating material 52, e.g., silicon dioxide.

FIG. 2B depicts the product 40 after a contact opening 54 has been formed in the layer of insulating material 52 for a self-aligned contact. Although the contact etch process performed to form the opening 54 is primarily directed at removing the desired portions of the layer of insulating material 52, portions of the protective gate cap layer 46 and the protective sidewall spacers 48 get consumed during the contact etch process, as simplistically depicted in the dashed regions 56. Given that the cap layer 46 and the spacers 48 are attacked in the contact etch process, the thickness of these protective materials must be sufficient such that, even after the contact etch process is completed, there remains sufficient cap layer material and spacer material to protect the gate structures 41. Accordingly, device manufacturers tend to make the cap layers 46 and spacers 48 "extra thick," i.e., with an additional thickness that may otherwise not be required but for the consumption of the cap layers 46 and the spacers 48 during the contact etch process. In turn, increasing the thickness of such structures, i.e., increasing the thickness of the gate cap layers 46, causes other problems, such as increasing the aspect ratio of the contact opening 54 due to the increased height, increasing the initial gate height, which makes the gate etching and spacer etching processes more difficult, etc.

As device dimensions continue to shrink, self-aligned contacts are needed to prevent an electrical short between the gate and the source/drain contact element. As noted above, in prior art processing techniques, a relatively thick gate cap layer 46 (e.g., silicon nitride) is formed to protect the underlying metal layers in the gate electrode 44 from being exposed during the source/drain contact etch process which results in the formation of the contact opening 54 (see FIGS. 2A-2B). If the gate electrode materials are exposed during the contact etch process, then an electrical short will be formed between the gate electrode 44 and the source/drain contact element (not shown) that will be formed in the contact opening 54. There are two ways to "make room" in the gate cavity 20 for the gate cap layer 46 by recessing the work function metal materials within the gate cavity 20. A first approach involves filling the remaining portions of the gate cavity 20 with a relatively thick work function metal until it (collectively) is "pinched-off" within the gate cavity 20, and thereafter performing an etching process to recess it down, thereby making room for the gate cap layer 46. This approach is very challenging due to the fact that the work function metals are typically comprised of multiple layers of metal (e.g., TiN/TiC/TiN. TiN/TaC/TiN, etc.) that are layered within the gate cavity 20 so that a uniform recess is not easy to form by a single etch-back process. Also, due to the "pinch-off" that typically occurs when forming such layers of metal, there are inevitable void/seam formations due to the very small size of the gate cavity as these material layers are formed, which further increases the difficulty of the etch-back process that is performed to recess the various metal layers. A second approach involves formation of relatively thinner work function metal layer(s) so as to not "pinch-off" the gate cavity 20, then fill in the sacrificial material, such as OPL or a flowable oxide, that can reliably fill the remaining portions of the gate cavity 20. Then, the sacrificial material may be recessed so as to expose the desired portions of the work function metal to be removed, the exposed portions of the work function metals are then removed by etching while the remaining portions of the sacrificial material protect the underlying metal layers. Thereafter, the sacrificial material may be removed from within the gate cavity 20. While this latter approach tends to produce better results, as gate lengths continue to shrink (e.g., 15 nm or less), the required work function metal thickness (e.g., 7 nm) simply fills too much of the gate cavity, with the result being that there is little, if any, space left within the gate cavity 20 for the sacrificial material that is used in the recess etching process.

The present disclosure is directed to various methods of forming FinFET semiconductor devices using a replacement gate technique and the resulting semiconductor devices that may avoid, or at least reduce, the effects of one or more of the problems identified above.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure is directed to various methods of forming FinFET semiconductor devices using a replacement gate technique and the resulting semiconductor devices. One exemplary device disclosed herein includes first and second fins defined in a semiconductor substrate and a raised isolation post structure positioned between the first and second fins, wherein an upper surface of the raised isolation post structure is at a level that is approximately equal to or greater than a level corresponding to an upper surface of each of the first and second fins. The disclosed device further includes, among other things, a first space defined by a sidewall of the first fin and a first sidewall of the raised isolation post structure, a second space defined by a sidewall of the second fin and a second sidewall of the raised isolation post structure, and a gate structure positioned around a portion of each of the first and second fins and around a portion of the raised isolation post structure, wherein at least portions of the gate structure are positioned in the first and second spaces.

Another illustrative device of the present disclosure includes, among other things, first and second fins defined in a semiconductor substrate, a layer of insulating material extending laterally across a portion of the semiconductor substrate between the first and second fins, and a raised isolation post structure positioned above the layer of insulating material and between the first and second fins, wherein an upper surface of the raised isolation post structure is at a height level above the semiconductor substrate that is approximately equal to or greater than a height level of an upper surface of each of the first and second fins above the semiconductor substrate. Furthermore, a gate structure is positioned around a portion of each of the first and second fins and around a portion of the raised isolation post structure, wherein at least portions of the gate structure are positioned in a first space between the first fin and the raised isolation post structure and in a second space between the raised isolation post structure and the second fin.

Yet a further exemplary embodiment of the presently disclosed subject matter is a device that includes first and second fins defined in a semiconductor substrate, a layer of insulating material extending laterally across a portion of the semiconductor substrate between the first and second fins, and a liner layer extending laterally across an upper surface of the layer of insulating material between the first and second fins. Additionally, the disclosed device further includes, among other things, a raised isolation post structure positioned above the liner layer and between the first and second fins, wherein an upper surface of the raised isolation post structure is at a height level above the semiconductor substrate that is approximately equal to or greater than a height level of an upper surface of each of the first and second fins above the semiconductor substrate. Moreover, a gate structure is positioned around a portion of each of the first and second fins and around a portion of the raised isolation post structure, wherein at least portions of the gate structure are positioned in a first space between the first fin and the raised isolation post structure and in a second space between the raised isolation post structure and the second fin. Furthermore, the gate structure includes a layer of high-k insulating material and a layer of work function adjusting metal material, wherein the layer of high-k insulating material extends continuously from the first fin to the second fin and is positioned on and in direct physical contact with upper and sidewall surfaces of the first fin, a first upper surface portion of the liner layer between the first fin and the raised isolation post structure, upper and sidewall surfaces of the raised isolation post structure, a second upper surface portion of the liner layer between the raised isolation post structure and the second fin, and upper and sidewall surfaces of the second fin.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1G depict one illustrative prior art method of forming a gate structure of a transistor using a so-called "replacement gate" technique;

Figure 1G:
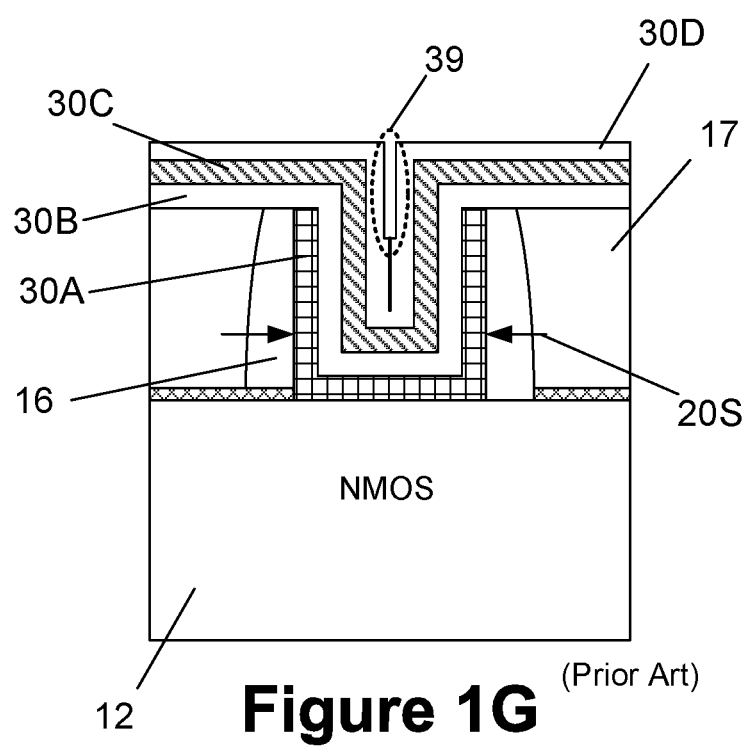
Figure 2A:
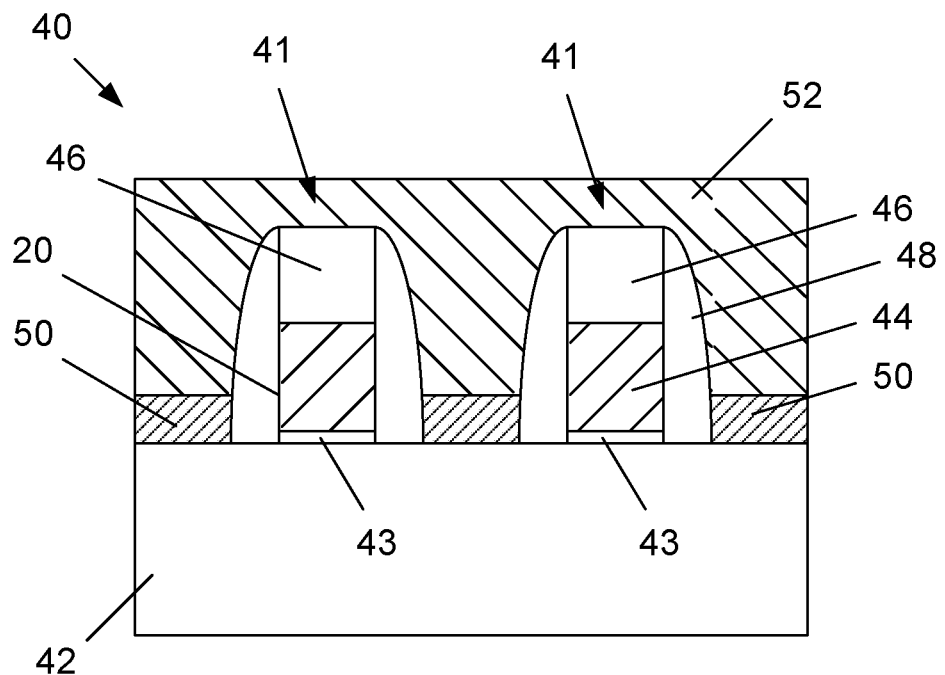
FIGS. 2A-2B schematically illustrate a cross-sectional view of an illustrative prior art integrated circuit product that employs self-aligned contacts.
Figure 2B:
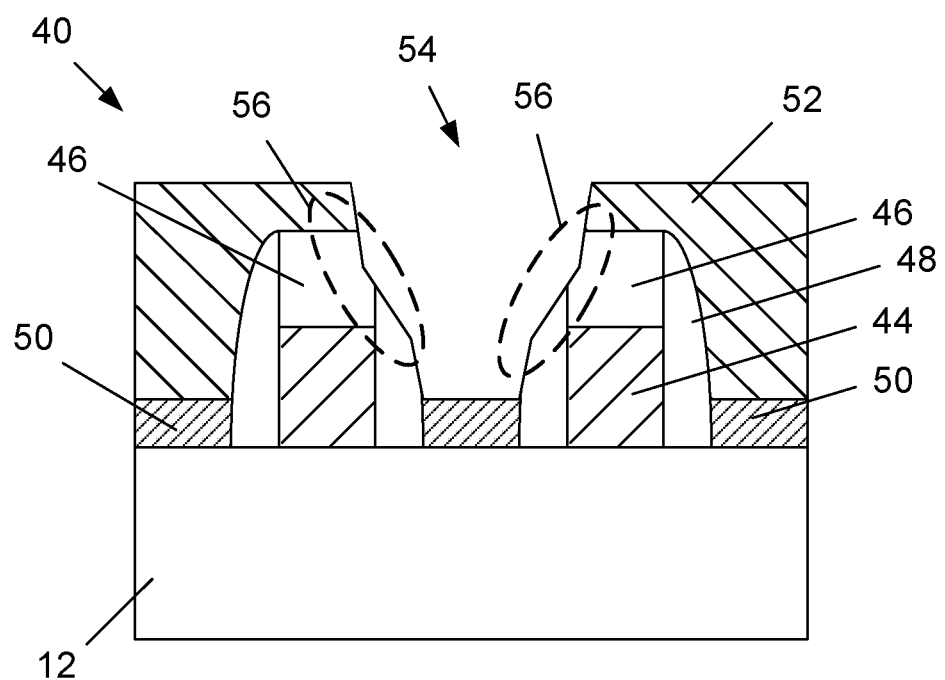

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming semiconductor devices using a replacement gate technique. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs. For purposes of disclosure, reference will be made to an illustrative process flow wherein a single FinFET device 100 is formed. Of course, the inventions disclosed herein should not be considered to be limited to the illustrative examples depicted and described herein. With reference to the attached figures, various illustrative embodiments of the methods and devices disclosed herein will now be described in more detail.

FIGS. 3A-3V depict various illustrative methods disclosed for forming FinFET semiconductor devices using a replacement gate technique and the resulting semiconductor devices. The illustrative device 100 will be formed in and above the semiconductor substrate 102. The device 100 may be either an NMOS or a PMOS transistor. Additionally, various doped regions, e.g., source/drain regions, halo implant regions, well regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

FIGS. 3A-3V present various views of one illustrative embodiment of a FinFET device 100 that may be formed using the methods disclosed herein. The drawings also include a simplistic plan view of the device 100 (in the upper right corner) that depicts the location where various cross-sectional views depicted in the following drawings will be taken. More specifically, the view "X-X" is a cross-sectional view that is taken through the source/drain regions of the device in a direction that is transverse to the long axis of the fins, the view "Y-Y" is a cross-sectional view that is taken through the gate structure of the device, and the view "Z-Z" is a cross-sectional view taken through the fins of the device, i.e., along the long axis of a fin (the current transport direction).

FIG. 3A depicts the device 100 at a point in fabrication wherein several process operations have been performed. First, a plurality of trenches 102T was formed in the substrate 102 to thereby define a plurality of fins 106 within an active region 104. The illustrative FinFET device 100 disclosed herein will be depicted as being comprised of two illustrative fins 106 with an upper surface 106S. However, as will be recognized by those skilled in the art after a complete reading of the present application, the methods and devices disclosed herein may be employed when manufacturing FinFET devices having any number of fins. In one embodiment, the trenches 102T were formed by performing one or more etching processes through one or more patterned etch masks (not shown) e.g., a patterned hard mask layer, using known etching techniques.

The patterned etch masks may be patterned using known sidewall image transfer techniques and/or photolithographic techniques, combined with performing known etching techniques. In some applications, a further etching process may be performed to reduce the width or to "thin" the fins 106, although such a thinning process is not depicted in the attached drawings. For purposes of this disclosure and the claims, the use of the terms "fin" or "fins" should be understood to refer to fins that have not been thinned as well as fins that have been subjected to such a thinning etch process. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Also depicted in FIG. 3A is an illustrative recessed layer of insulating material 107 having an upper surface 107S that is formed above the substrate 102. The layer of insulating material 107 may not be employed in all applications, as will be discussed more fully below. In one illustrative process flow, the layer of insulating material 107 (e.g., silicon dioxide) was initially formed above the device 100 so as to over-fill the trenches 102T. Then, one or more planarization processes (e.g., CMP) were performed on the layer of insulating material 107 such that the upper surface of the layer of insulating material 107 was substantially even with the upper surface 106S of the fins 106. Next, a timed, recess etching process was performed on the exposed portions of the layer of insulating material 107 to form a recessed layer of insulating material 107 having the recessed surface 107S. Effectively this produces a thinner layer of the insulating material 107 in the bottom of the trenches 102T so as to locally isolate the fins 106 from one another.

With continuing reference to FIG. 3A, the overall size, shape and configuration of the trenches 102T and fins 106 may vary depending on the particular application. The depth and width of the trenches 102T may vary depending upon the particular application. In one illustrative embodiment, based on current day technology, the depth of the trenches 102T may range from approximately 40-100 nm and the width of the trenches 102T may be about 20-60 nm. In some embodiments, the fins 106 may have a final width (at or near the bottom of the fin) within the range of about 5-20 nm. In the illustrative examples depicted in the attached figures, the trenches 102T and fins 106 are all of a uniform size and shape. However, such uniformity in the size and shape of the trenches 102T and the fins 106 is not required to practice at least some aspects of the inventions disclosed herein. In the examples depicted herein, the trenches 102T are formed by performing an anisotropic etching process that results in the trenches 102T having a schematically depicted, generally rectangular configuration. In an actual real-world device, the sidewalls of the trenches 102T may be somewhat inwardly tapered, although that configuration is not depicted in the drawings. In some cases, the trenches 102T may have a reentrant profile near the bottom of the trenches 102T. To the extent the trenches 102T are formed by performing a wet etching process, the trenches 102T may tend to have a more rounded configuration or non-linear configuration as compared to the generally rectangular configuration of the trenches 102T that are formed by performing an anisotropic etching process. Thus, the size and configuration of the trenches 102T and the fins 106, and the manner in which they are made, should not be considered a limitation of the present invention. For ease of disclosure, only the substantially rectangular trenches 102T and fins 106 will be depicted in subsequent drawings.

Figure 3B:
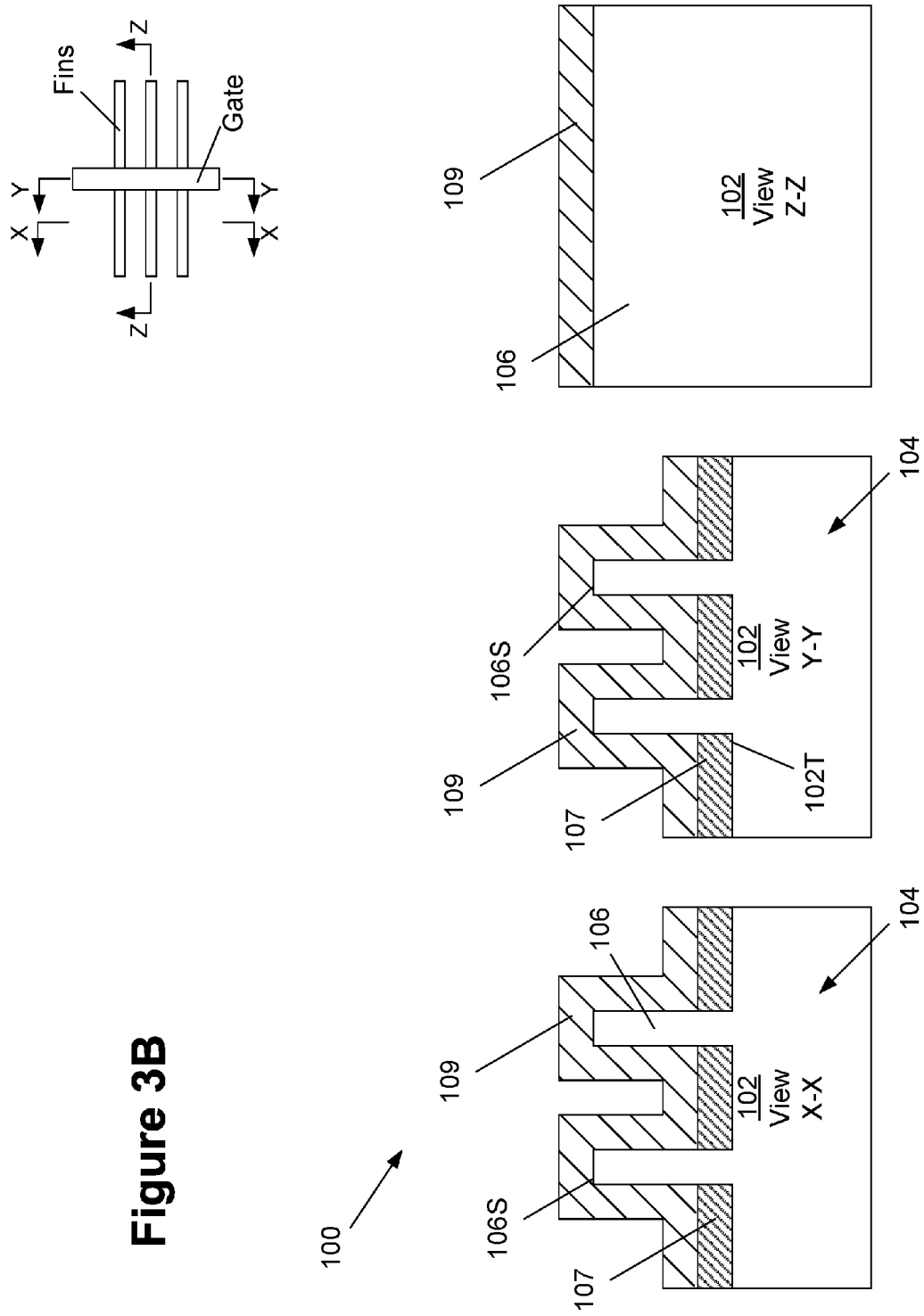
FIGS. 3A-3V depict various illustrative methods disclosed for forming FinFET semiconductor devices using a replacement gate technique and the resulting semiconductor devices.

FIG. 3B depicts the device after a liner layer 109 has been formed on the device 100 by performing a conformal deposition process. The liner layer 109 may be comprised of a variety of materials, e.g., silicon nitride, $Al_2O_3$, etc., and it may be formed by performing a conformal ALD or CVD process. Typically, the thickness of the liner layer 109 may be selected to be the target thickness of the work function metal plus twice the thickness of the high-k dielectric layer that will be formed as part of the replacement gate structure for the device 100, as described more fully below. In terms of absolute numbers, the thickness of the liner layer 109 may vary between about 8-13 nm depending upon the particular application.

Figure 3C:
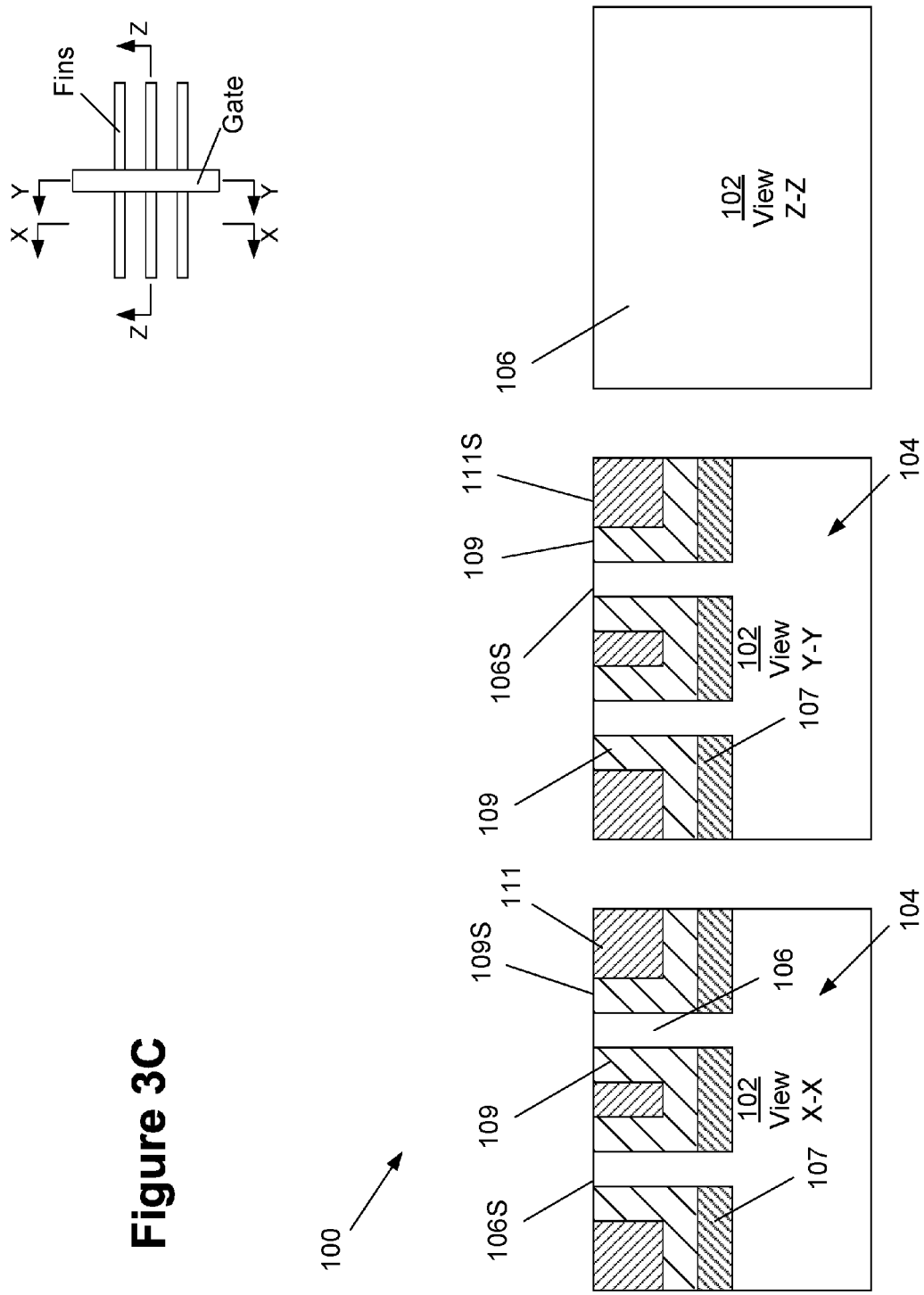

FIG. 3C depicts the device 100 after several process operations were performed. First, a layer of insulating material 111 (e.g., silicon dioxide) was formed above the device 100 using traditional deposition techniques. Then, one or more planarization processes (e.g., CMP) were performed on the layer of insulating material 111 such that the upper surface 111S of the layer of insulating material 111 is substantially even with the upper surface 106S of the fins 106. In one illustrative embodiment, the planarization process may be a chemical mechanical planarization (CMP) process that stops on the fins 106.

Figure 3D:
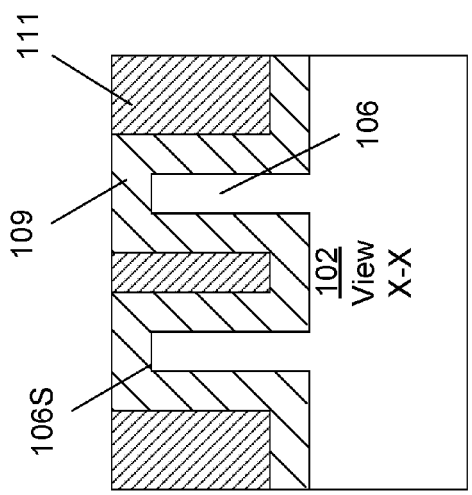
Figure 3D:
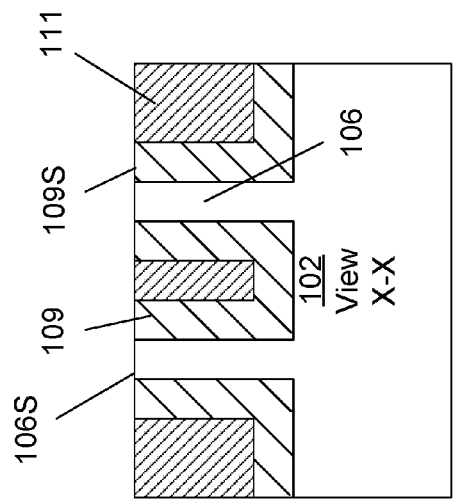
Figure 3D:
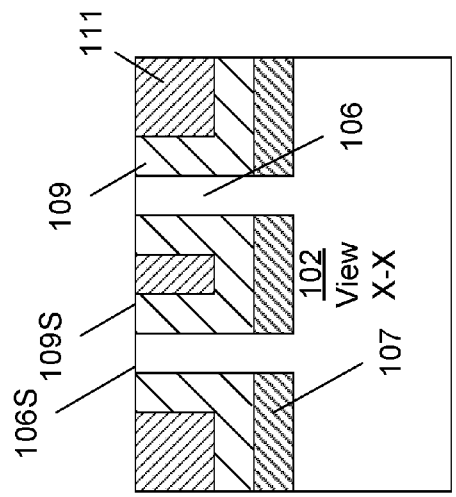
Figure 3D:
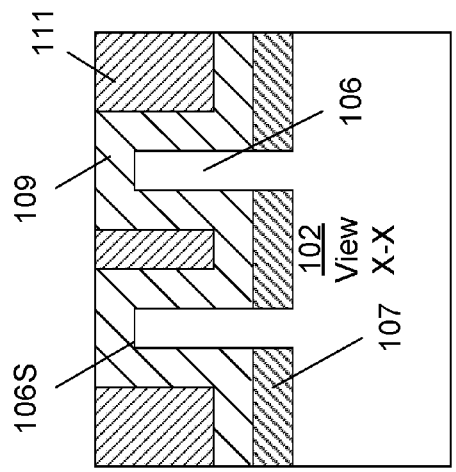

FIG. 3D presents four different options (1-4) as it relates to the formation of the layer of insulating material 107, the layer of insulating material 111 and the planarization step that is performed after forming the layer of insulating material 111. Any of the four options may be employed in the methods and device disclosed herein. As depicted, the layer of insulating material 107 is present in options 1 and 2, but not present in options 3 and 4. Additionally, in options 1 and 4, the planarization process that was performed after the layer of insulating material 111 was formed stops on the upper surface 106S of the fins 106. In contrast, in options 2 and 3, the planarization process that was performed after the layer of insulating material 111 was formed stops on the liner layer 109. The "option 1" embodiment will be depicted in the subsequent drawings but, as noted above, any of the options 1-4 may be employed with the methods and devices disclosed herein.

In the examples disclosed herein, the FinFET device 100 will be formed using a replacement gate technique. Accordingly, FIG. 3E depicts the device 100 at a point in fabrication wherein the materials for a sacrificial gate structure, i.e., a sacrificial gate insulation layer 122 and a sacrificial gate electrode layer 124 have been formed above the substrate 102 and the fins 106. Also depicted is an illustrative gate cap layer 140 that has been formed above the sacrificial gate electrode layer 124. At this point in the replacement gate process flow, an anneal process would have already been performed to activate the implanted dopant materials and repair any damage to the substrate 102 due to the various ion implantation processes that were performed. The various components and structures of the device 100 may be formed using a variety of different materials and by performing a variety of known techniques. For example, the sacrificial gate insulation layer 122 may be comprised of silicon dioxide and the sacrificial gate electrode layer 124 may be comprised of polysilicon. The gate cap layer 140 may be comprised of a variety of materials, e.g., silicon nitride. The thickness of the layers of material shown in FIG. 3E may vary depending upon the particular application.

Figure 3F:
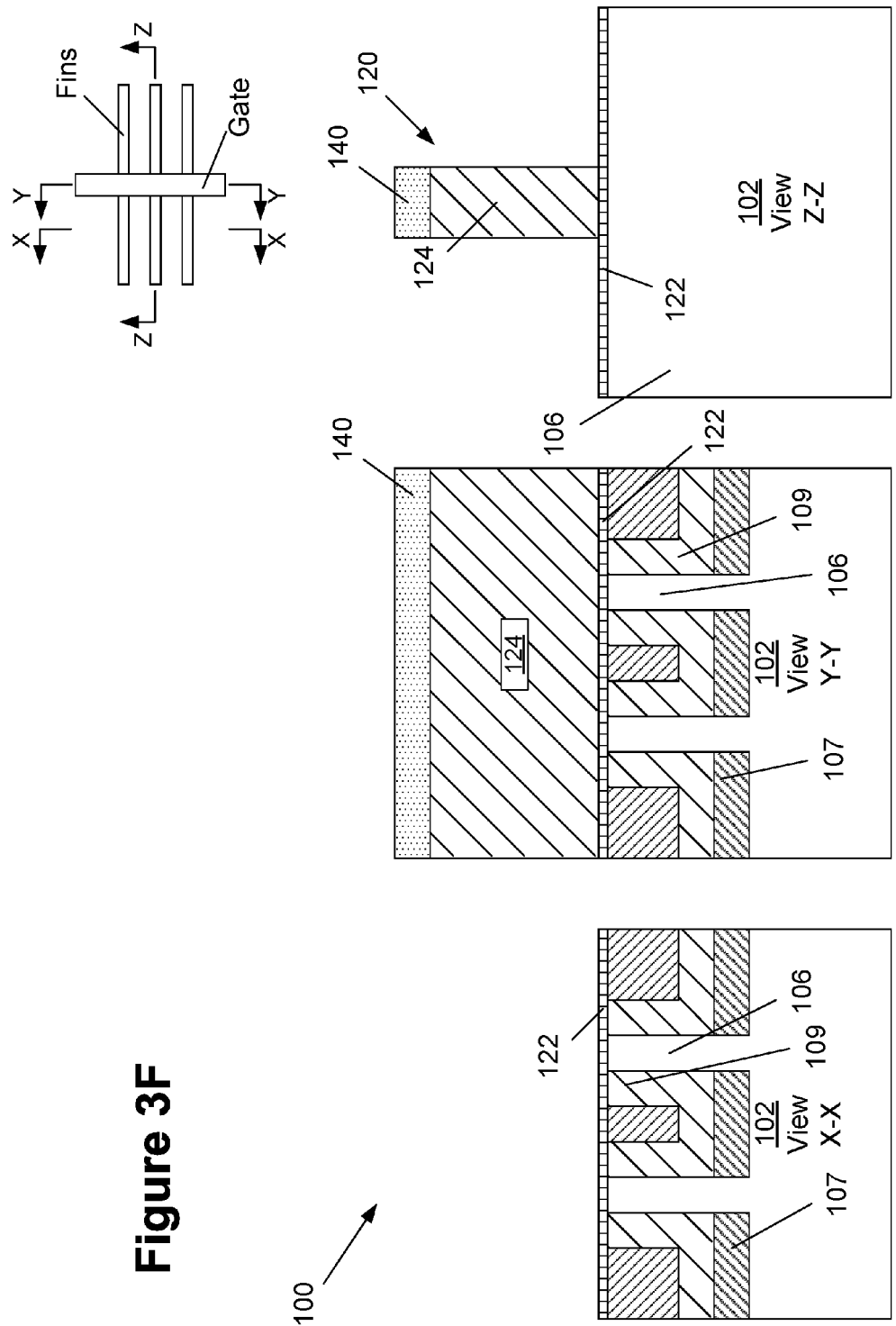

FIG. 3F depicts the device 100 after one or more etching processes were performed through a patterned etch mask (not shown) to pattern the cap layer 140 and the layer of sacrificial gate electrode 124, which will become part of the sacrificial gate structure 120. In this illustrative process flow, the sacrificial gate insulation layer 122 serves as an etch stop layer when patterning the sacrificial gate insulation layer 124. The "width" of the gate structure 120 (which corresponds approximately to the channel length of the device 100) may vary depending upon the particular application.

Figure 3G:
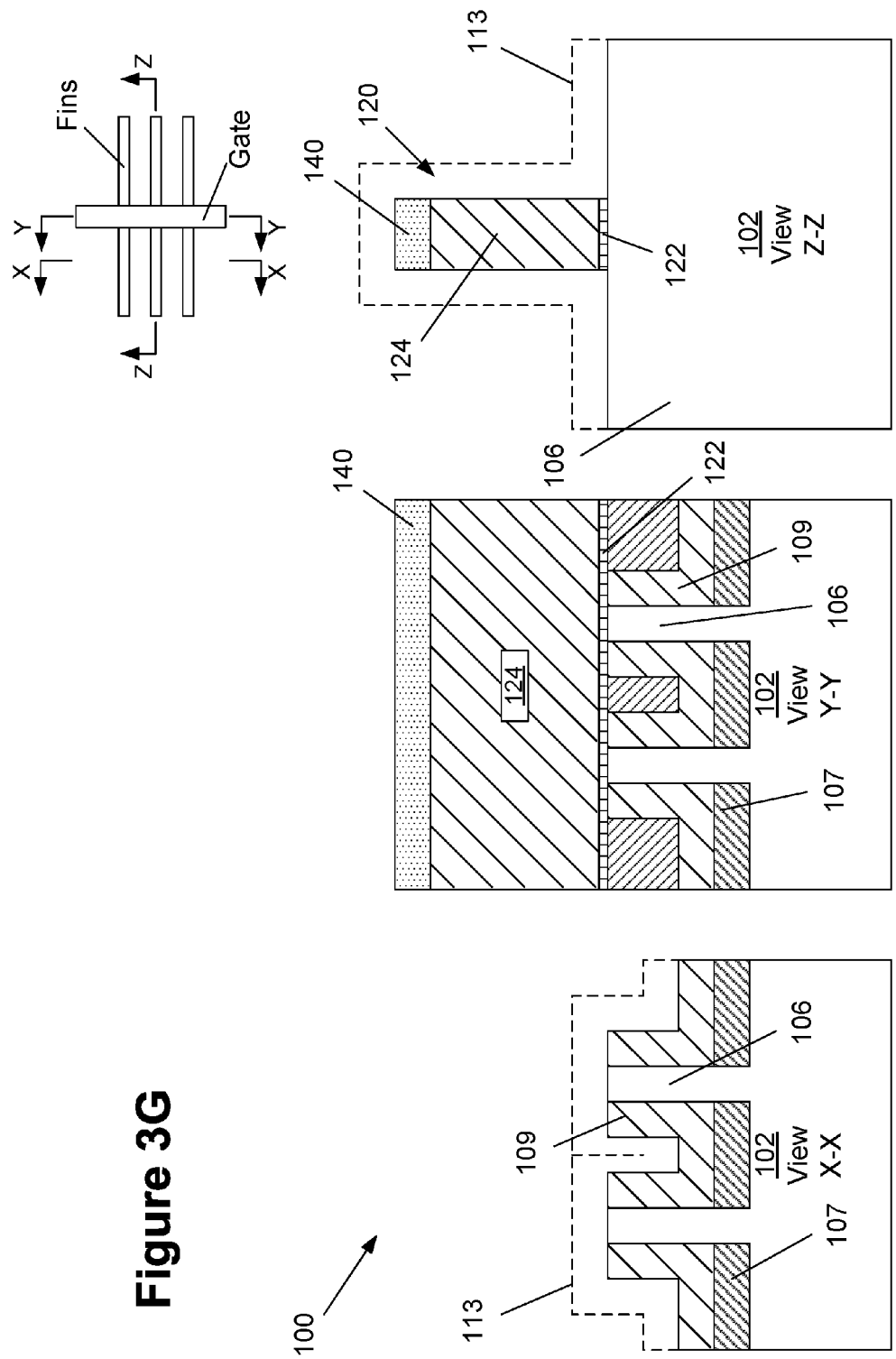

FIG. 3G depicts the device 100 after the above-mentioned patterned etch mask was removed and after one or more etching processes were performed to remove the exposed portions of the sacrificial gate insulation layer 122 (see view Z-Z) and the exposed portions of the layer of insulating material 111 (see view X-X). This process operation results in the formation of the sacrificial gate structure 120, i.e., the sacrificial gate insulation layer 122 and the sacrificial gate electrode 124.

Figure 3H:
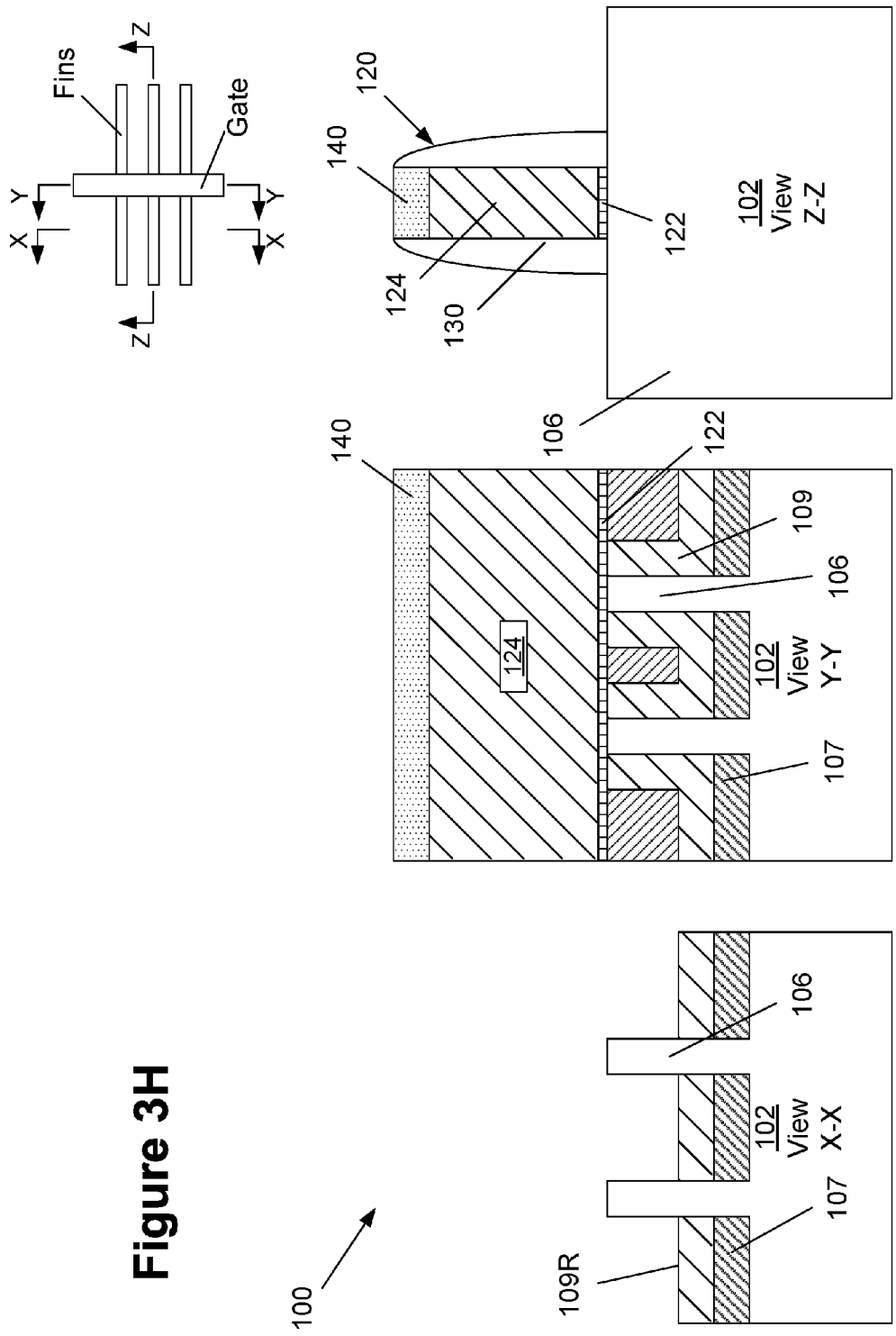

FIG. 3H depicts the device after sidewall spacers 130 are formed adjacent the sacrificial gate structure 120 (view Z-Z). The sidewall spacers 130 may be comprised of a variety of different materials, e.g., silicon nitride. In one embodiment, the sidewall spacers 130 may be made of the same material (or one having similar etch characteristics) as that of the liner layer 109. The sidewall spacers 130 may be formed by depositing a layer of spacer material (shown with dashed line 113 in FIG. 3G) and thereafter performing an anisotropic etching process to produce the spacers 130. In the case where the liner layer 109 is comprised of the same material (or one having similar etch characteristics) as that of the spacers 130, the etching process may be continued to remove at least the portions of the liner layer 109 positioned adjacent the fins 106 (see view X-X). Due to the presence of the layer of spacer material 111, all of the horizontally oriented portions of the liner layer 109 (see view X-X) between the fins 106 may not be removed when the spacers 130 are formed. In the case where the liner layer 109 is made of a material that may be selectively etched relative to the spacers 130 and the surrounding materials, a different etch chemistry may be employed to remove the desired portions of the liner layer 109.

Figure 3I:
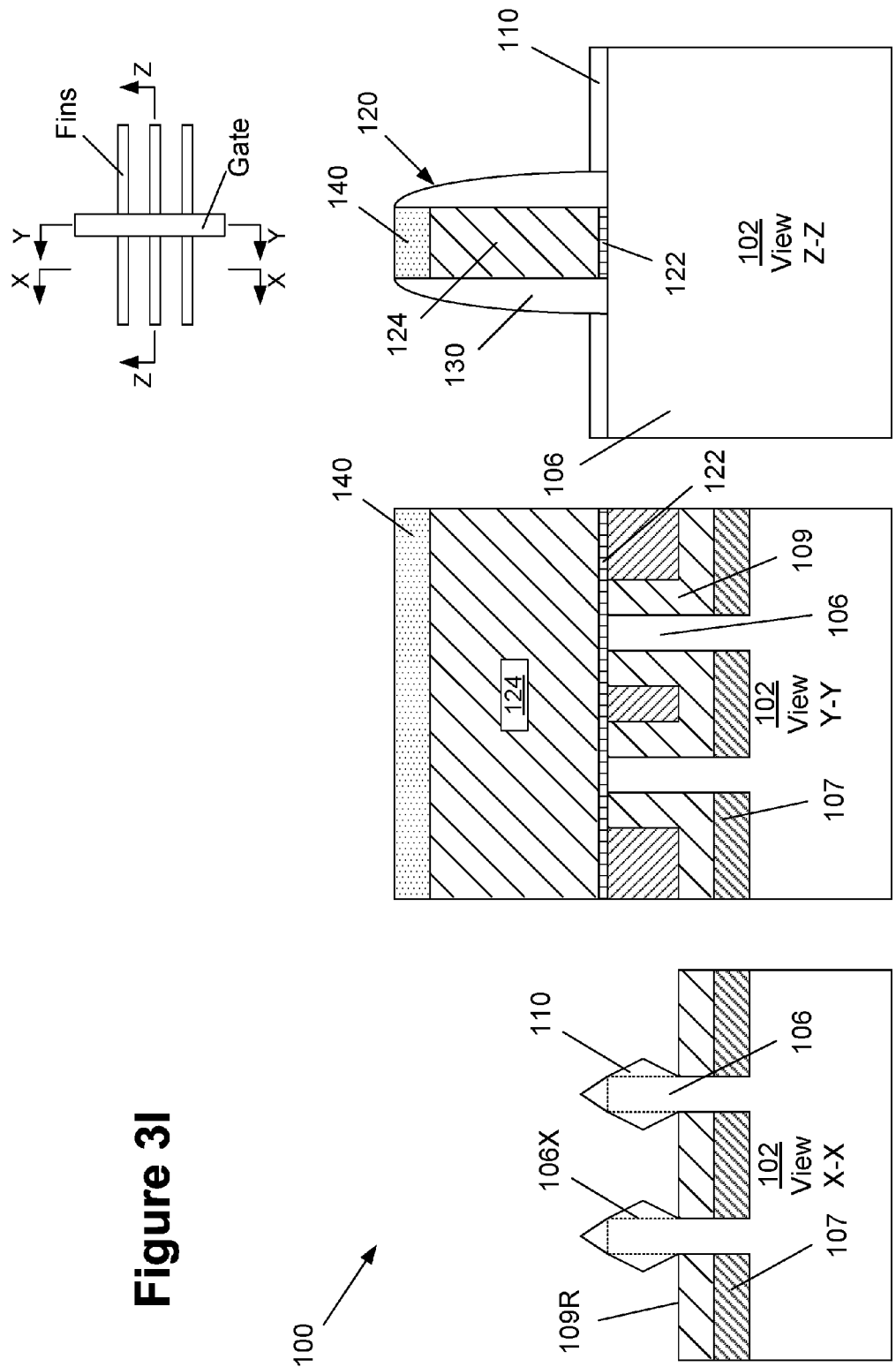

FIG. 3I depicts the device 100 after an optional epi growth process was performed to form additional semiconductor material 110, e.g., silicon on the exposed surfaces of the fins 106. See views X-X and Z-Z. A dashed-line 106X reflects the outline of the original fins 106. The generally diamond-shaped configuration of the semiconductor material 110 (see view X-X) is due to the way the epi growth process proceeds and the orientation of the crystallographic planes in the substrate material. The epi growth process is typically performed to increase the size of the material to which a conductive contact will later have to be formed. In some cases, if desired, a so-called fin-merger epi growth process is performed such that the epi material grown on one fin merges into the epi material grown on an adjacent fin. Such merged fins are not depicted in the drawings. As noted above, the formation of this additional semiconductor material 110 is not required in all applications. Metal silicide material (not shown) may be formed on the additional semiconductor material if desired.

FIG. 3J depicts the device 100 after several process operations were performed. First, a layer of insulating material 121 (e.g., silicon dioxide) was formed above the device 100 using traditional deposition techniques. Then, one or more planarization processes (e.g., CMP) were performed on the layer of insulating material 121 such that the upper surface 121S of the layer of insulating material 121 is substantially even with the upper surface 124S of the sacrificial gate electrode 124. Importantly, this planarization process exposes the upper surface 124S of the sacrificial gate electrode 124 such that it can be removed. In one illustrative embodiment, the planarization process may be a chemical mechanical planarization (CMP) process that stops on the sacrificial gate electrode 124.

FIG. 3K depicts the device 100 after one or more wet or dry etching processes were performed to remove the sacrificial gate electrode 124 and the sacrificial gate insulation layer 122 to thereby define a gate cavity 136 where a replacement gate structure will subsequently be formed for the device 100. Typically, the sacrificial gate insulation layer 122 is removed as part of the replacement gate technique, as depicted herein. Even in cases where the sacrificial gate insulation layer 122 is intentionally removed, there will typically be a very thin native oxide layer (not shown) that forms on the surface 106S of the fins within the gate cavity 136. To the extent that the removal of the sacrificial gate structure 120 causes any consumption of the exposed portions of the layer of insulating material 111 (view Y-Y), such consumption is not depicted in the attached drawings.

Figure 3L:
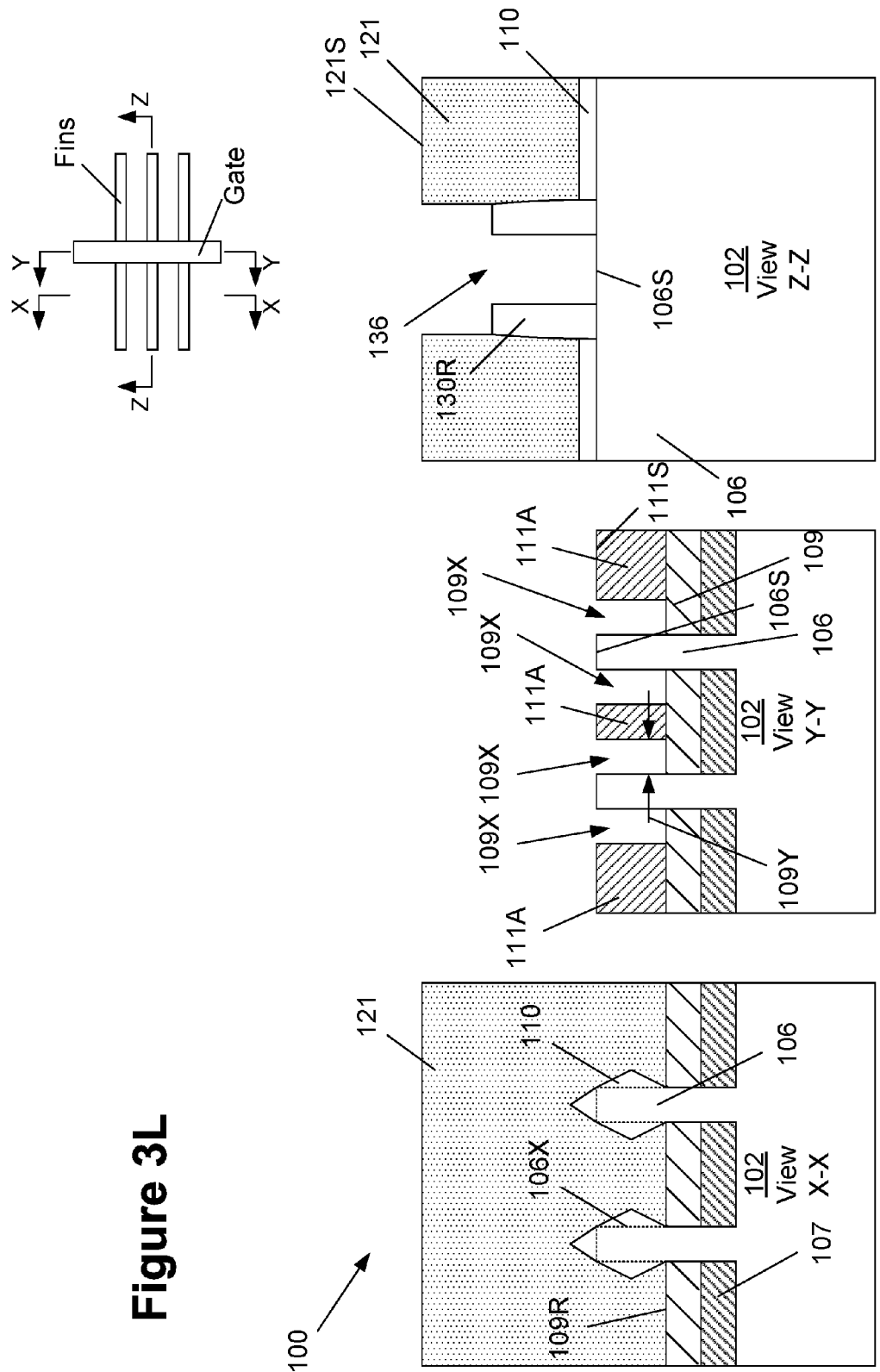

FIG. 3L depicts the device after one or more etching processes were performed to reduce the height of the spacers 130 (thereby forming recessed spacers 130R) and to remove portions of the liner layer 109 exposed within the gate cavity 136. More specifically, this etching process removes portions of the liner layer 109 adjacent the fins 106 in the area defined by the gate cavity 136. The removal of the portions of the liner layer 109 may be accomplished by performing a timed etching process. This process operation effectively defines the final fin height for the fins 106. Additionally, this process operation results in the formation of spaces 109X between the fins 106 and the raised isolation posts 111A within the area defined by the gate cavity 136 that are made from the layer of insulating material 111. In one example, the upper surface 111S of the raised isolation posts 111A is approximately level with the upper surface 106S of the fins 106. As noted above, the lateral width 109Y of the spaces 109X is typically selected to be about the sum of twice the thickness of the high-k dielectric and the target thickness of the work function adjusting metal layer for the device, as described more fully below.

The next major process sequence involves formation of the replacement gate structure for the device 100. The replacement gate structure that will be depicted herein is intended to be representative in nature of any type of gate structure that may be employed in manufacturing integrated circuit products using so-called gate-last (replacement-gate) manufacturing techniques. Accordingly, with reference to FIG. 3M, a pre-clean process was performed in an attempt to remove all foreign materials from within the gate cavity 136 prior to forming the various layers of material that will become part of the replacement gate structure. Next, a high-k (k value greater than 10) gate insulation layer 125, such as hafnium oxide (or the other high-k materials noted in the background section of this application), is deposited across the substrate 102 and within the gate cavity 136 by performing a conformal deposition process.

Thereafter, as shown in FIG. 3N, a work function adjusting metal layer 127 (e.g., a layer of titanium nitride or TiAlC depending upon the type of transistor device being manufactured) is deposited on the high-k gate insulation layer 125 and within the gate cavity 136 by performing a conformal deposition process. Of course, the work function adjusting metal layer 127 may be comprised of any of the metals described in the background section of this application. As will be appreciated by those skilled in the art after a complete reading of the present application, the methods disclosed herein provide a novel manner in which to avoid or limit "pinch-off" problems when it comes to forming metal-containing replacement gate structures. That is, in one example, the lateral width 136X (see also FIG. 3K) of the gate cavity 136 may be about 15-19 nm wide. Typically, the work function adjusting metal layer 127, e.g., TiC, is required to be formed to a thickness of about 7 nm. Thus, if a 7 nm thick layer of the work function adjusting metal layer 127 were directly deposited on the high-k insulation layer 125, i.e., on sidewalls and bottom surface of the gate cavity 136, the lateral width of the gate cavity 136 would be reduced to about 1-5 nm (7 nm being formed on each sidewall), which would make performing subsequent processing operations very challenging if not impossible. However, using the methods disclosed herein, the thickness of the work function adjusting metal layer 127 to be deposited in the gate cavity 136 is selected to be about one-half of the final desired thickness of the work function adjusting metal layer 127 that is to be formed on the sidewalls of the fins 106 in the spaces 109X. That is, the lateral width 109Y of the spaces 109X is approximately twice the thickness of the deposited work function adjusting metal layer 127. Thus, if the overall target thickness of the work function adjusting metal layer is 7 nm, as in the example discussed above, the work function adjusting metal layer 127 depicted herein may be deposited with a reduced target thickness of about 3.5 nm, or about one-half of the overall target thickness of the work function adjusting metal layer 127. This thinner work function adjusting metal layer 127 will effectively fill the remaining spaces 109X and thereby produce the desired thickness (e.g., 7 nm) on the sidewalls of the fins 106.

Additionally, by formation of the thinner work function adjusting metal layer 127 in the gate cavity 136, the chance for "pinch off" is reduced or eliminated. More specifically, ignoring the thickness of the high-k gate insulation layer 125, the lateral thickness 136X of the gate cavity 136 may be about 15-19 nm. Thus, when the thinner work function adjusting metal layer 127, e.g., a 3.5 nm thick layer of material, is directly deposited on the high-k insulation layer 125, i.e., on sidewalls and bottom surface of the gate cavity 136, the reduced lateral width 136Z (view Z-Z) of the gate cavity 136 is now about 8-12 nm (3.5 nm being formed on each sidewall), as compared to about 1-5 nm that would be remaining if the work function adjusting metal layer 127 were deposited with a thickness of about 7 nm. Moreover, the formation of the thinner work function adjusting metal layer 127 makes the resulting gate cavity wider, which makes performing subsequent processing operations much easier than when using traditional replacement gate manufacturing techniques. Accordingly, one aspect of the inventions disclosed herein involves depositing a layer of a work function adjusting metal material 127 with a target thickness of about one-half of an overall target thickness of the work function adjusting metal material for the device in a gate cavity 136 and in the spaces 109X.

The next process operation involves recessing the upper portions of at least the work function adjusting metal layer 127. FIG. 3O depicts one illustrative process flow for accomplishing this task. To that end, FIG. 3O depicts the device 100 after a sacrificial layer of material 141, such as DUO, has been formed above the device and its surface 141S has been recessed to a desired level such that at least the work function adjusting metal layer 127 above the level of the surface 141S may be removed from within the gate cavity 136. The sacrificial layer of material 141 is a material that has good gap fill capabilities. The sacrificial layer of material 141 may be formed by a spin-coating process and its surface may be recessed by performing a timed etching process.

FIG. 3P depicts the device after one or more etching processes were performed to remove at least the work function adjusting metal layer 127 above the level of the surface of the sacrificial layer of material 141 from within the gate cavity 136. In the depicted process flow, the high-k gate insulation layer 125 is not removed during this process operation.

Figure 3Q:
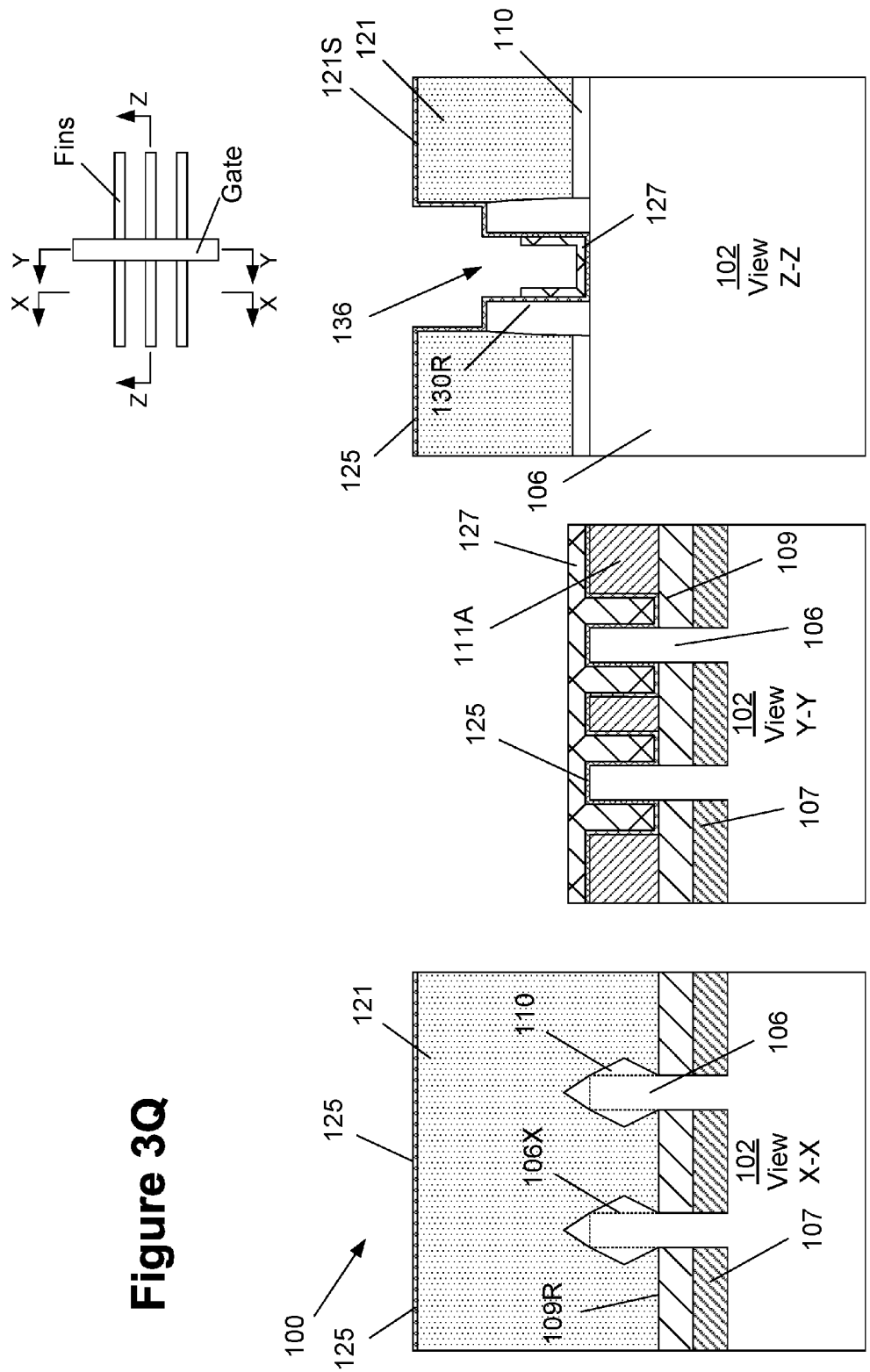

FIG. 3Q depicts the device 100 after the sacrificial layer of material 141 has been removed. The sacrificial layer of material 141 may be removed by using a variety of known techniques depending upon the material selected for the sacrificial layer of material 141, e.g., a wet stripping process.

Figure 3R:
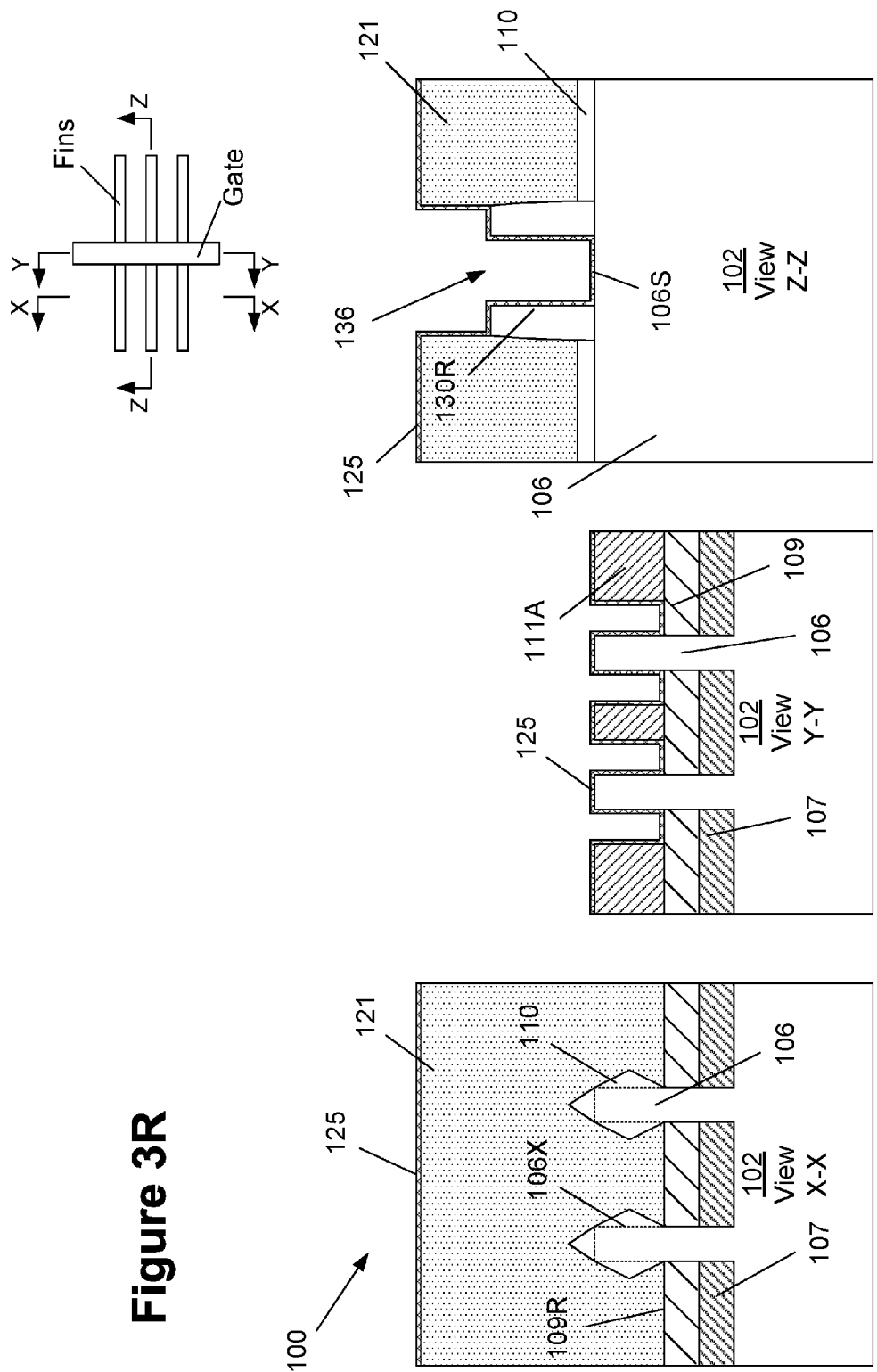
Figure 3S:
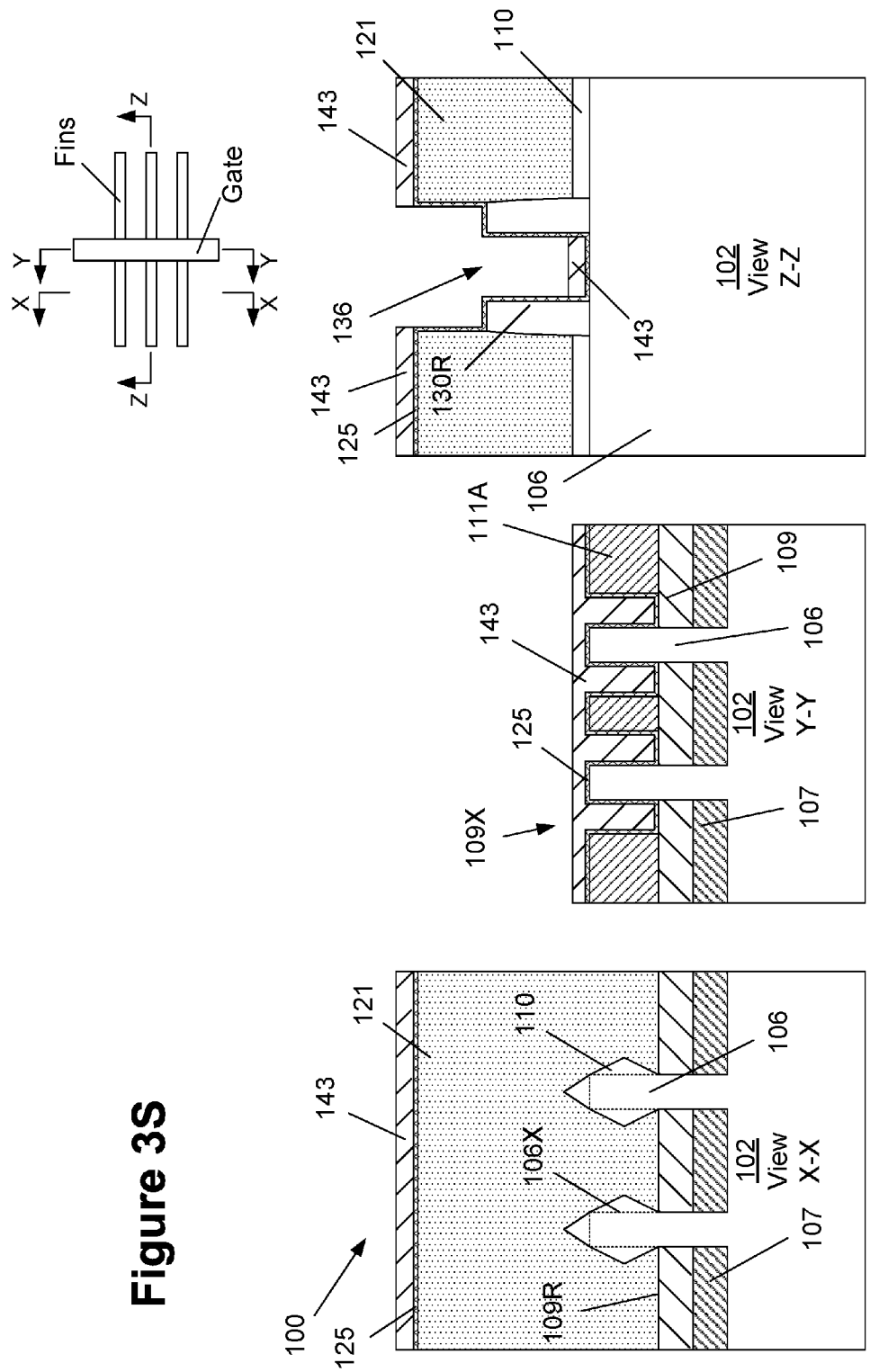

FIGS. 3R-3S depict another possible process flow for reducing the amount of the work function adjusting material positioned within the gate cavity 136. Starting with the structure shown in FIG. 3N, the initial step in this alternative process flow involves performing an isotropic etching process to remove the work function adjusting metal layer 127 from above the high-k gate insulation layer 125 across the substrate. Next, an RF PVD process is performed to form the desired work function metal layer 143 at the bottom of the gate cavity 136 and above the fin/high-k gate insulation layer 125. Either of the process flows shown in FIGS. 3N-3S may be employed using the methods disclosed herein. However, only the first option, with the resulting structure shown in FIG. 3Q, will be depicted in the subsequent drawings.

FIG. 3T depicts the device 100 after several process operations were performed. First, a bulk conductive material layer 145, such as tungsten or aluminum, was blanket-deposited above the substrate so as to over-fill the gate cavity 136. Thereafter, one or more CMP processes are performed to remove excess portions of the conductive material layer 145 and the high-k gate insulation layer 125 positioned outside of the gate cavity 136 above the surface 121S of the layer of insulating material 121. Then, an etching process was performed on the conductive material layer 145 such that the desired amount of the conductive material layer 145 remains positioned within the gate cavity 136. This operation results in the formation of the replacement gate structure 133 comprised of the high-k gate insulation layer 125, the work function adjusting metal layer 127 and the conductive material layer 145.

Figure 3U:
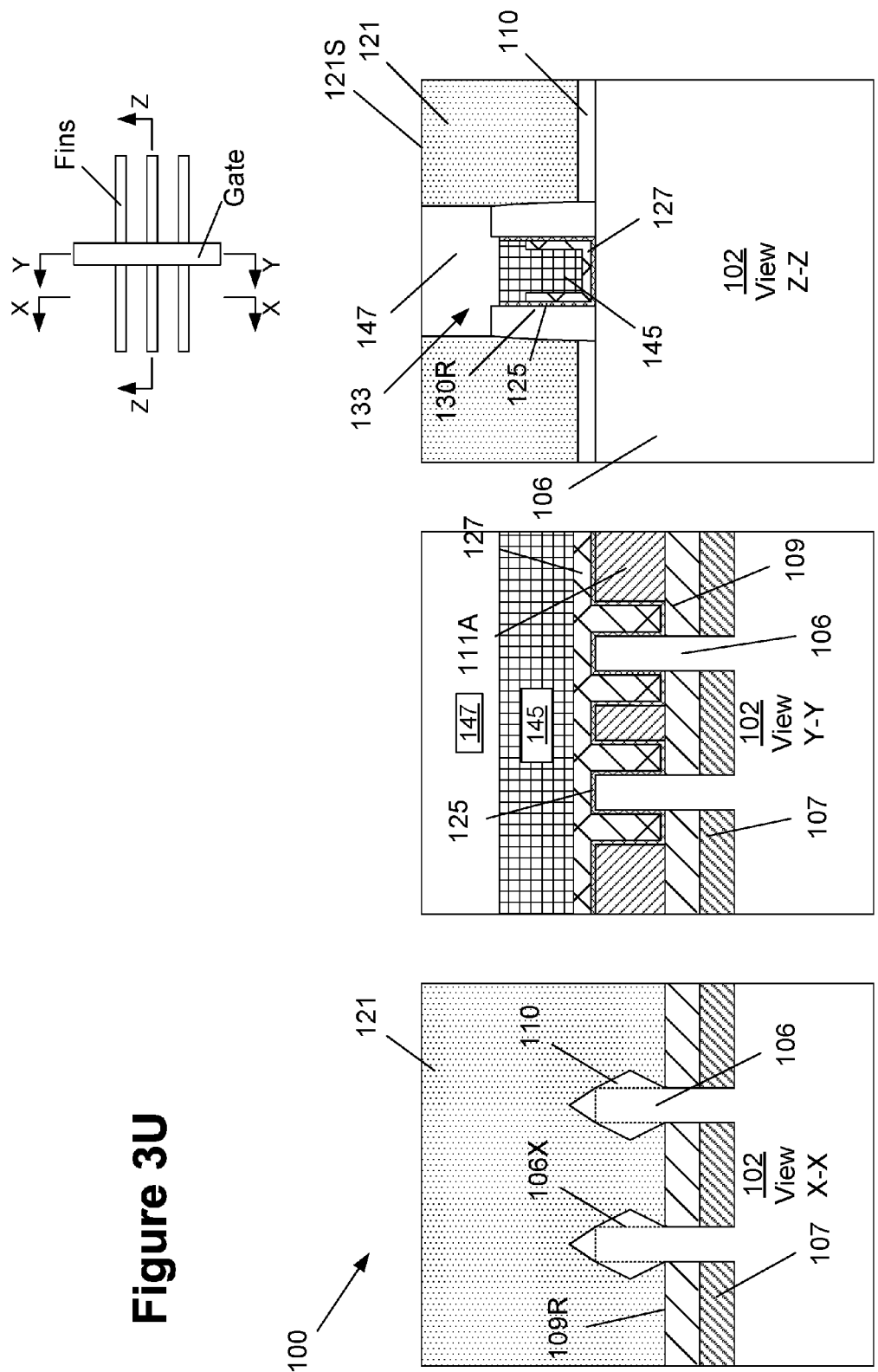

FIG. 3U depicts the device 100 after an illustrative gate cap layer 147 was formed in the recess above the conductive material layer 145. The gate cap layer 147 is typically comprised of silicon nitride and it may be formed by depositing a layer of gate cap material so as to over-fill the recess formed in the gate cavity 136 above the replacement gate structure 133 and, thereafter, performing a CMP process to remove excess portions of the gate cap material layer positioned above the surface of the layer of insulating material 121. The gate cap layer 147 is formed so as to protect the underlying gate materials during subsequent processing operations.

FIG. 3V depicts the device 100 after several process operations were performed to form a conductive source/drain contact structure 154 to each of the source/drain regions of the device 100. A gate contact structure (not shown) that is conductively coupled to the replacement gate structure 133, i.e., to the conductive gate materials that are part of the replacement gate structure 133, may also be formed as part of these process operations. Typically, this processing sequence involves forming a layer of insulating material 152 above the device 100 and thereafter performing one or more etching processes through one or more etch mask layers (not shown) on the exposed portions of the layer of insulating material 152 to define contact openings for the source/drain conductive structures 154. The source/drain contact structures 154 may be of any desired cross-sectional configuration when viewed from above, e.g., square, rectangular, round, etc. The source/drain contact structures 154 are intended to be schematic and representative in nature, as they may be formed using any of a variety of different conductive materials and by performing traditional manufacturing operations. The contact structures 154 may also contain one or more barrier layers (not depicted). In one illustrative example, the contact structures 154 may be formed by depositing a liner, e.g., Ti, TiN, followed by overfilling the contact openings with a conductive material, such as tungsten. Thereafter, a CMP process may be performed to planarize the upper surface of the layer of insulating material 152, which results in the removal of excess portions of the liner and the tungsten positioned above the layer of insulating material 152 outside of the contact openings and the formation of the contact structures 154.

The above embodiment has been disclosed in the context of forming an illustrative multiple fin FinFET device. However, as will be appreciated by those skilled in the art after a complete reading of the present application, the methods disclosed herein may also be employed in connection with the formation of a single fin FinFET device. In one embodiment, such a method involves, among other things, performing at least one etching process so as to define a fin in a substrate, wherein the fin has sidewalls, forming an isolation structure around the fin, wherein first and second gaps are defined on opposite sides of the fin by the isolation structure, wherein a lateral width of each of the first and second gaps is equal to or less than the a dimension corresponding to the overall target thickness of a work function adjusting metal material plus twice the target thickness of a high-k gate insulation layer to be formed in a gate cavity for the device, forming a gate cavity above a portion of the fin, and depositing a layer of the work function adjusting metal material with a target thickness of about one-half of the overall target thickness of the work function adjusting metal material in the gate cavity and in the first and second gaps between the fin and the isolation material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A device, comprising:
   first and second fins defined in a semiconductor substrate;
   a raised isolation post structure positioned between said first and second fins, wherein an upper surface of said raised isolation post structure is at a level that is approximately equal to or greater than a level corresponding to an upper surface of each of said first and second fins;
   a first space defined by a sidewall of said first fin and a first sidewall of said raised isolation post structure;
   a second space defined by a sidewall of said second fin and a second sidewall of said raised isolation post structure; and
   a gate structure positioned around a portion of each of said first and second fins and around a portion of said raised isolation post structure, said gate structure extending across and continuously covering said first sidewall of said raised isolation post, said second sidewall of said raised isolation post, and a top surface of said portion of said raised isolation post structure, wherein at least portions of said gate structure are positioned in said first and second spaces, said gate structure comprising a layer of high-k insulating material that is positioned on and in direct physical contact with said raised isolation post.

2. The device of claim 1, wherein said gate structure further comprises a work function adjusting metal layer positioned on said layer of high-k insulating material, and wherein said layer of high-k insulating material is positioned on and in direct physical contact with said first fin and said second fin.

3. The device of claim 1, wherein said gate structure comprises a work function adjusting metal layer having a first thickness at a location above said upper surface of said first and second fins, and wherein each of said first and second spaces has a lateral width that corresponds to approximately twice said first thickness.

4. The device of claim 1, further comprising a layer of insulating material positioned between said first and second fins, wherein said raised isolation post structure is positioned above an upper surface of said layer of insulating material.

5. The device of claim 4, wherein said layer of insulating material extends laterally between said sidewall of said first fin and said sidewall of said second fin.

6. The device of claim 4, further comprising a liner layer positioned between said first and second fins and above said layer of insulating material, wherein said raised isolation post structure is positioned above an upper surface of said liner layer.

7. The device of claim 6, wherein said liner layer extends laterally between said sidewall of said first fin and said sidewall of said second fin.

8. The device of claim 6, wherein said gate structure comprises a layer of high-k insulating material and a work function adjusting metal layer positioned on said layer of high-k insulating material, said layer of high-k insulating material extending continuously over upper and sidewall surfaces of said first fin, a first upper surface of said liner layer between said first fin and said raised isolation post structure, upper and sidewall surfaces of said raised isolation post structure, a second upper surface portion of said liner layer between said raised isolation post structure and said second fin, and upper and sidewall surfaces of said second fin.

9. The device of claim 1, wherein said raised isolation post structure comprises an insulating material.

10. The device of claim 1, wherein said raised isolation post structure is laterally spaced apart and separated from each of said first and second fins such that said raised isolation post structure does not contact either of said first or second fins.

11. The device of claim 1, wherein said raised isolation post structure is a single raised isolation post structure that is laterally spaced apart from and positioned between said first and second fins, said first sidewall being on an opposite side of said single raised isolation post structure from said second sidewall.

12. A device, comprising:
first and second fins defined in a semiconductor substrate;
a layer of insulating material extending laterally across a portion of said semiconductor substrate between said first and second fins;
a raised isolation post structure positioned above said layer of insulating material and between said first and second fins, wherein an upper surface of said raised isolation post structure is at a height level above said semiconductor substrate that is approximately equal to or greater than a height level of an upper surface of each of said first and second fins above said semiconductor substrate; and
a gate structure positioned around a portion of each of said first and second fins and around a portion of said raised isolation post structure, said gate structure extending across and continuously covering said first sidewall of said raised isolation post, said second sidewall of said raised isolation post, and a top surface of said portion of said raised isolation post structure, wherein at least portions of said gate structure are positioned in a first space between said first fin and said raised isolation post structure and in a second space between said raised isolation post structure and said second fin, said gate structure comprising a layer of high-k insulating material that is positioned on and in direct physical contact with said raised isolation post.

13. The device of claim 12, wherein said gate structure further comprises a work function adjusting metal layer positioned on said layer of high-k insulating material, and wherein said layer of high-k insulating material extends continuously from said first fin to said second fin and is positioned on and in direct physical contact with said first fin and said second fin.

14. The device of claim 12, wherein said gate structure comprises a work function adjusting metal layer having a first thickness at a location above said upper surfaces of said first and second fins and said raised isolation post structure, and wherein a lateral width of each of said first and second spaces is approximately twice said first thickness.

15. The device of claim 12, further comprising a liner layer extending laterally across an upper surface of said layer of insulating material between said first and second fins, wherein said raised isolation post structure is positioned above an upper surface of said liner layer.

16. The device of claim 15, wherein said layer of insulating material and said liner layer each contact sidewalls of said first and second fins.

17. A device, comprising:
first and second fins defined in a semiconductor substrate;
a layer of insulating material extending laterally across a portion of said semiconductor substrate between said first and second fins;
a liner layer extending laterally across an upper surface of said layer of insulating material between said first and second fins;
a raised isolation post structure positioned above said liner layer and between said first and second fins, wherein an upper surface of said raised isolation post structure is at a height level above said semiconductor substrate that is approximately equal to or greater than a height level of an upper surface of each of said first and second fins above said semiconductor substrate; and
a gate structure positioned around a portion of each of said first and second fins and around a portion of said raised isolation post structure, wherein at least portions of said gate structure are positioned in a first space between said first fin and said raised isolation post structure and in a second space between said raised isolation post structure and said second fin, said gate structure comprising a layer of high-k insulating material and a layer of work function adjusting metal material, wherein said layer of high-k insulating material extends continuously from said first fin to said second fin and is positioned on and in direct physical contact with upper and sidewall surfaces of said first fin, a first upper surface portion of said liner layer between said first fin and said raised isolation post structure, upper and sidewall surfaces of said raised isolation post structure, a second upper surface portion of said liner layer between said raised isolation post structure and said second fin, and upper and sidewall surfaces of said second fin.

18. The device of claim 17, wherein said layer of work function adjusting metal material has a first thickness at a location above said upper surfaces of said first and second fins, and wherein a lateral width of each of said first and second spaces is approximately twice said first thickness.

19. The device of claim 17, wherein said layer of insulating material and said liner layer each contact sidewalls of said first and second fins.

20. The device of claim 17, wherein said raised isolation post structure is positioned directly on an upper surface of said liner layer.

* * * * *